United States Patent
Lambert et al.

(10) Patent No.: US 11,211,866 B2
(45) Date of Patent: Dec. 28, 2021

(54) RECONFIGURABLE INDUCTOR

(71) Applicant: Intel Corporation, Santa Clara, CA (US)

(72) Inventors: William J. Lambert, Tempe, AZ (US); Kaladhar Radhakrishnan, Chandler, AZ (US); Beomseok Choi, Chandler, AZ (US); Krishna Bharath, Chandler, AZ (US); Michael J. Hill, Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/642,268

(22) PCT Filed: Sep. 28, 2017

(86) PCT No.: PCT/US2017/054071
§ 371 (c)(1),
(2) Date: Feb. 26, 2020

(87) PCT Pub. No.: WO2019/066865
PCT Pub. Date: Apr. 4, 2019

(65) Prior Publication Data
US 2021/0036618 A1 Feb. 4, 2021

(51) Int. Cl.
*H02M 3/158* (2006.01)
*G01R 19/165* (2006.01)
(Continued)

(52) U.S. Cl.
CPC .... *H02M 3/1584* (2013.01); *G01R 19/16538* (2013.01); *G05F 1/465* (2013.01);
(Continued)

(58) Field of Classification Search
None
See application file for complete search history.

(56) References Cited

U.S. PATENT DOCUMENTS

2004/0201931 A1\* 10/2004 Korcharz ............... H02J 9/061
361/18
2007/0007935 A1 1/2007 Johnson
(Continued)

FOREIGN PATENT DOCUMENTS

KR 10-2016-0001620 1/2016

OTHER PUBLICATIONS

International Preliminary Reporton Patentability for International Patent Application No. PCT/US2017/054071, dated Apr. 9, 2020, 16 pgs.

(Continued)

*Primary Examiner* — Jeffrey A Gblende
(74) *Attorney, Agent, or Firm* — Schwabe, Williamson & Wyatt, P.C.

(57) ABSTRACT

An adjustable inductance system includes a plurality of inductor modules coupled to a corresponding plurality of loads and a pool of at least one floating inductor module that may be coupled in parallel with any one of the plurality of inductor modules. A control circuit monitors the current drawn through the inductor module by the load. If current draw exceeds a threshold, the control circuit couples a floating inductor module to the load. Using the current drawn by the load, the control circuit determines an appropriate inductance value and determines an appropriate inductor configuration for the inductor module, the floating inductor module, or both the inductor module and the floating inductor module to achieve the determined inductance value. The control circuit causes switching elements to transition to a state or position to achieve the inductor configuration.

23 Claims, 11 Drawing Sheets

(51) Int. Cl.
*G05F 1/46* (2006.01)
*H01F 21/02* (2006.01)
*H02M 1/00* (2006.01)
*H02M 3/156* (2006.01)

(52) U.S. Cl.
CPC ............ *H01F 21/02* (2013.01); *H02M 1/008* (2021.05); *H02M 1/0009* (2021.05); *H02M 1/0032* (2021.05); *H02M 3/1566* (2021.05)

(56) References Cited

U.S. PATENT DOCUMENTS

| | | |
|---|---|---|
| 2010/0033236 A1 | 2/2010 | Triantfillou |
| 2013/0207731 A1* | 8/2013 | Balteanu .................. H03F 1/56 330/296 |
| 2013/0293207 A1* | 11/2013 | Wei ..................... H02M 3/1584 323/272 |
| 2013/0313996 A1 | 11/2013 | Williams |
| 2014/0210429 A1 | 7/2014 | Dally |
| 2015/0194900 A1* | 7/2015 | Zheng ............... H02M 3/33546 363/17 |
| 2017/0060205 A1* | 3/2017 | Bharalh .................... G06F 1/26 |
| 2018/0123443 A1* | 5/2018 | Sreenivas ............ H02M 1/083 |
| 2018/0323712 A1* | 11/2018 | Traube ................ H02M 3/1584 |

OTHER PUBLICATIONS

International Search Report and Written Opinion for International Patent Application No. PCT/US2017/054071, dated Aug. 31, 2018, 17 pgs.

\* cited by examiner

RECONFIGURABLE INDUCTOR

CROSS-REFERENCE TO RELATED APPLICATIONS

This patent application is a U.S. National Phase Application under 35 U.S.C. § 371 of International Application No. PCT/US2017/054071, filed on Sep. 28, 2017, the entire contents of which is hereby incorporated by reference herein.

TECHNICAL FIELD

The present disclosure relates to inductors used in power delivery applications.

BACKGROUND

As central processing units (CPUs) have moved from 22 nanometer silicon to 14 nm silicon, and then to 10 nm silicon, the area available for power delivery components has scaled downward while power requirements have remained constant or have even increased. This poses a challenge for on-package voltage regulators, such as those used to provide power to CPU cores, because the area available in the package for the on-package voltage regulator inductors is roughly equal to the circuitry powered by the on-package voltage regulator. Consequently, the on-package voltage regulator inductors used on a 10 nm die require the same or greater maximum current carrying capability in roughly 60% of the area occupied by the same inductor on a 14 nm CPU.

Products equipped with a "turbo" or similar operating mode may routinely operate at a low current demand, but may exert a higher current demand upon entering the higher performance "turbo" mode. Unless the inductors included in the on-package voltage regulator are able to support the current demand in the "turbo" mode, system performance must be reduced to a point where the inductors are able to safely handle the current flow. Further, inductors capable of handling high current flows associated with operation in the "turbo" mode may not be optimal for handling the relatively low currents associated with normal operation, increasing losses while in the normal operating mode, and in battery powered devices, compromising battery life.

BRIEF DESCRIPTION OF THE DRAWINGS

Features and advantages of various embodiments of the claimed subject matter will become apparent as the following Detailed Description proceeds, and upon reference to the Drawings, wherein like numerals designate like parts, and in which:

Figure 1:
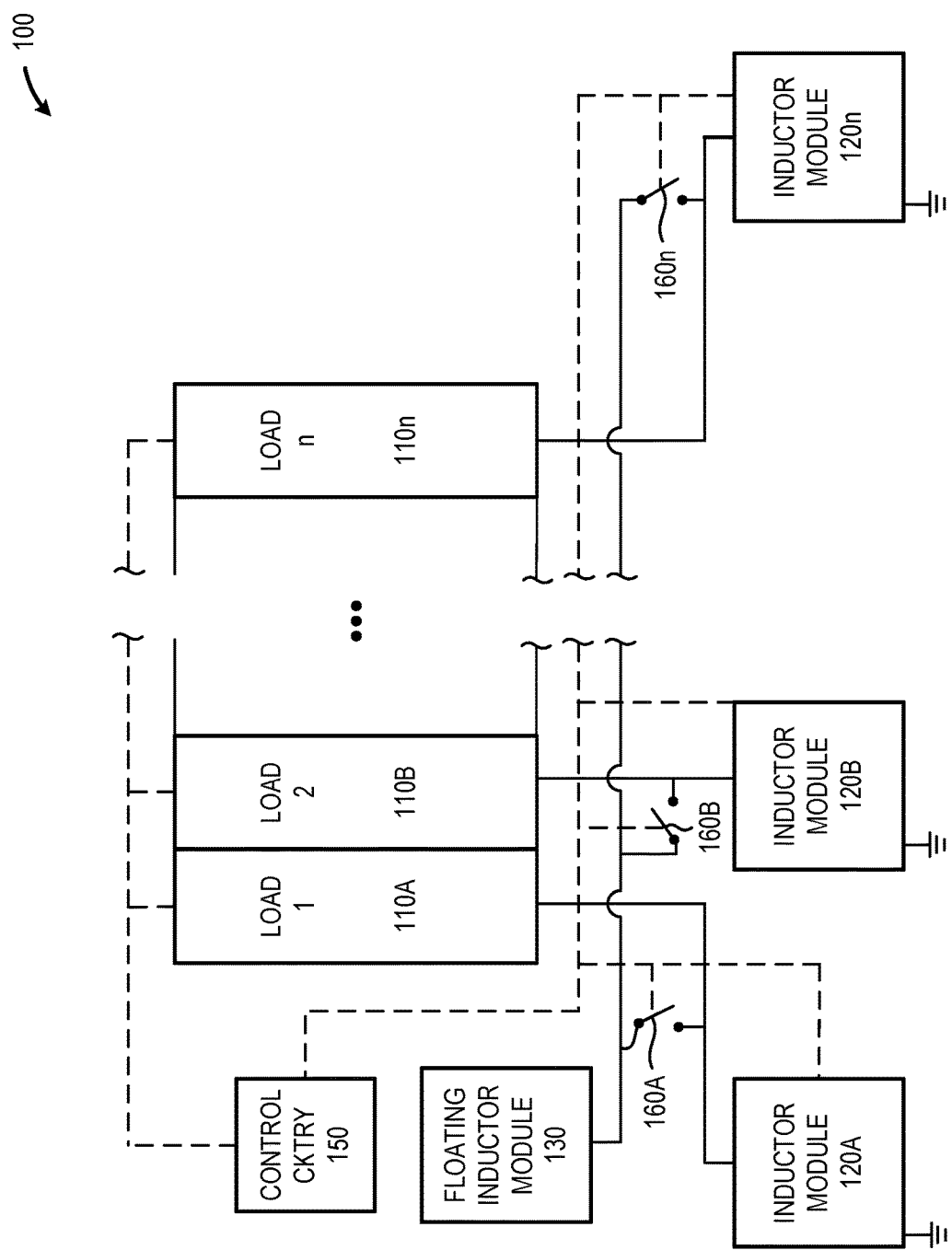
FIG. 1 is a schematic of an illustrative system that includes a number of loads each having a respective, conductively coupled, inductor module, a number of floating inductor modules, and control circuitry, in accordance with at least one embodiment described herein.

Although the following Detailed Description will proceed with reference being made to illustrative embodiments, many alternatives, modifications and variations thereof will be apparent to those skilled in the art.

DETAILED DESCRIPTION

The systems and methods described herein include an on-package voltage regulator having a floating inductor module that, based on load current demand, may be conductively coupled to a non-floating inductor module to provide an inductance matched to the current demand placed upon a the on-package voltage regulator. The floating inductor module may include a number of inductors and a number of switching elements configured to provide either a fixed inductance value or a variable or selectable range of inductance values. The non-floating inductor module may have either a fixed inductance value or may also include a number of inductors and a number of switching elements to provide a range of inductance values.

In systems containing multiple loads (e.g., "N" loads), the systems and methods described herein provide "N" non-floating inductor modules, one non-floating inductor module conductively coupled to each of the multiple loads. Such systems may include at least one floating inductor module that may be conductively coupled to any of the non-floating inductor modules to in response to an increased load current demand. Such an arrangement beneficially and advantageously reduces the number of inductor modules required to support operation of the system from "2*N" (i.e., 2 inductor modules coupled to each load) to "N+M" (i.e., 1 inductor module coupled to each load plus at least one floater inductor module capable of being coupled to any load) where M has any integer value less than "N."

In semiconductor packaging, the inductors included in the floating and non-floating inductor modules may include air-core inductors formed in a substrate material. The switching elements controlling the configuration of the inductors in the floating and non-floating inductor modules may be formed in the substrate, in a semiconductor die, or an interposer layer die, coupled to the substrate. In some instances, some or all of the switching elements may be formed in a dedicated interposer layer die positioned between the lowermost semiconductor die in a multi- or stacked-die semiconductor package and the substrate supporting the stacked-die semiconductor package. The switching elements may include relatively large, low-loss, switching elements placed in series with the inductors included in the floating and non-floating inductor modules. A control circuit disposed in the die stack monitors the current demand placed on the on-package voltage regulators by each power consumer (e.g., by each rail coupled to a CPU core). As the load (i.e., the load current demand) presented by the power consumer increases, the control circuit may conductively couple a floating inductor module to the non-floating inductor module while the high load condition exists. As the load decreases, the control circuit may decouple the floating inductor module from the non-floating inductor module, freeing the floating inductor module for use by another power consumer.

A power delivery system is provided. The power delivery system may include: a plurality of power delivery circuits, each of the circuits to supply a load current to a respective one of a plurality of conductively coupled loads; a plurality of inductor modules, each of the plurality of inductor modules having an allowable current threshold, each of the plurality of inductor modules conductively coupled to a respective one of the power delivery circuits; at least one floating inductor module, the at least one floating inductor module conductively couplable to any of the plurality of power delivery circuits; and control circuitry to: receive information indicative of the load current supplied to at least one power delivery circuit; receive information indicative of the allowable current threshold of the at least one power delivery circuit; and determine whether the load current supplied by the at least one power delivery circuit exceeds the allowable current threshold for the inductor module conductively coupled to the at least one power delivery circuit.

A power delivery method is provided. The method may include: receiving, by control circuitry, at least one signal containing information indicative of a load current supplied to a load by at least one power delivery circuit, the power delivery circuit including a conductively coupled inductor module; receiving, by control circuitry, at least one signal containing information indicative of an allowable current threshold of the inductor module conductively coupled to the power delivery circuit; and determining, by the control circuitry, whether the load current supplied by the at least one power delivery circuit exceeds the allowable current threshold for the inductor module.

A semiconductor package that includes a power delivery system is provided. The package may include: a semiconductor die that includes a one or more loads, each of the one or more load conductively coupled to a respective power delivery circuit; a semiconductor package substrate that includes: a plurality of inductor modules, each of the plurality of inductor modules conductively coupled to a respective one of the power delivery circuits, each of the plurality of inductor modules having a respective allowable current threshold; and at least one floating inductor module conductively coupleable to any of the processor cores; an interposer layer conductively coupling the semiconductor die with the semiconductor package substrate, the interposer layer including a plurality of switch elements to selectively conductively couple the at least one floating inductor module to each of the power delivery circuits; and control circuitry to: receive information indicative of the load current supplied to at least one power delivery circuit; receive information indicative of the allowable current threshold of the at least one power delivery circuit; and determine whether the load current supplied by the at least one power delivery circuit exceeds the allowable current threshold for the inductor module conductively coupled to the at least one power delivery circuit.

A non-transitory storage medium that includes machine-readable instructions is provided. The machine-readable instructions, when executed by control circuitry, cause the control circuitry to: receive, from at least one power delivery circuit, at least one signal containing information indicative of a load current supplied to a load by at least one power delivery circuit, the at least one power delivery circuit including a conductively coupled inductor module; receive at least one signal containing information indicative of an allowable current threshold of the inductor module conductively coupled to the at least one power delivery circuit; and determine whether the load current supplied by the at least one power delivery circuit exceeds the allowable current threshold for the inductor module.

A power distribution system is provided. The system may include: means for receiving at least one signal containing information indicative of a load current supplied to a load by at least one power delivery circuit, the power delivery circuit including a conductively coupled inductor module; means for receiving at least one signal containing information indicative of an allowable current threshold of the inductor module; and means for determining whether the load current supplied by the at least one power delivery circuit exceeds the allowable current threshold for the inductor module.

As used herein the terms "top," "bottom," "upper," "lower," "lowermost," and "uppermost" when used in relationship to one or more elements are intended to convey a relative rather than absolute physical configuration. Thus, an element described as an "upper film layer" or a "top element" in a device may instead form the "lowermost element" or "bottom element" in the device when the device is inverted. Similarly, an element described as the "lowermost element" or "bottom element" in the device may instead form the "uppermost element" or "top element" in the device when the device is inverted.

As used herein, the term "logically associated" when used in reference to a number of objects, systems, or elements, is intended to convey the existence of a relationship between the objects, systems, or elements such that access to one object, system, or element exposes the remaining objects, systems, or elements having a "logical association" with or to the accessed object, system, or element. An example "logical association" exists between relational databases where access to an element in a first database may provide information and/or data from one or more elements in a number of additional databases, each having an identified relationship to the accessed element. In another example, if "A" is logically associated with "B," accessing "A" will expose or otherwise draw information and/or data from "B," and vice-versa.

FIG. 1 is a schematic of an illustrative system 100 that includes a number of loads 110A-110n (collectively, "loads 110") each having a respective, conductively coupled, inductor module 120A-120n (collectively, "inductor modules 120"), a number of floating inductor modules 130, and control circuitry 150, in accordance with at least one embodiment described herein. In embodiments the control circuitry 150 selectively couples a floating inductor module 130 to a load 110 when the current demand presented by the load 100 exceeds the allowable current through the inductor module 120 coupled to the respective load. Such an arrangement beneficially and advantageously permits the use of a "pool" of floating inductor modules 130 that may be selectively coupled to a load 110 when the current demand of the respective load 110 exceeds a defined threshold value (e.g., the maximum allowable current through the inductor module 120x coupled to the load 110x).

The loads 110 may include one or more power consuming devices. In embodiments, each of the loads 110 may correspond to a processor core or similar power consuming structure within a multicore CPU. In other embodiments, each of the loads 110 may correspond to different components, devices, or modules (CPU, graphical processor, rotating storage device, solid-state storage device, etc.) within a larger system. In operation, each of the loads 110 may draw current from a system power supply at a fixed or a variable rate. In embodiments, each of the loads 110 may draw current within a first current range when in a first (e.g., "normal") operating mode and may draw a higher current within a second current range when in a second (e.g., "turbo") operating mode. For example, at least some of the loads 110 may draw a fixed or variable current in a range from $I_1$ to $I_2$ when the load is in a first "normal" operating mode and a fixed or variable current from $I_2$ to $I_3$ when the load is in a second "turbo" operating mode.

In embodiments, each of the inductor modules 120 may include one or more inductive elements that provide a fixed first inductance value. In other embodiments, each of the inductor modules 120 may include at least one inductive element and at least one switching element capable of providing a variable first inductance value. In yet other embodiments, each of the inductor modules 120 may include a plurality of inductive elements and a plurality of switching elements such that a range of first inductance values may be achieved. In some embodiments, each of the inductor modules 120 may include the same or similar plurality of inductive elements, thus each of the inductor modules 120 may produce the same range of inductive values, $L_1$ to $L_2$. In some embodiments, a first portion of the plurality of inductor modules 120 may include a first plurality of inductive elements capable of producing inductance values in a first inductance range, from $L_1$ to $L_2$, while a second portion of the plurality of inductor modules 120 may include a second plurality of inductive elements capable of producing inductance values in a second inductance range, from $L_3$ to $L_4$. In some implementations, the second inductance range may overlap a portion of the first inductance range. In some implementations the second inductance range may no overlap a portion of the first inductance range. In embodiments, the inductance range of each of the inductor modules 120 may be selected based, at least in part, on the normal or expected current demand of the respective load 110 to which the inductor module is conductively coupled.

The inductive elements included in each inductor module 120 may be the same or different. In embodiments, the inductive elements forming each inductor module 120 may be disposed in whole or in part in the semiconductor package substrate. In embodiments, the inductive elements included in each inductor module 120 may be communicably coupled to or detached from the load 110 based on the position or mode of the switching elements included in the inductor module 120. In embodiments, the inductive elements included in each inductor module 120 may be coupled in any series, parallel, or series/parallel combination. The inductive elements included in each inductor module 120 may each have an inductance of: about 1 nanohenry (nH) or less; about 5 nH or less; about 10 nH or less; about 50 nH or less; about 100 nH or less; about 500 nH or less; about 1 microhenry ($\mu$H) or less; about 10 $\mu$H or less; about 50 $\mu$H or less; about 100 $\mu$H or less; about 500 $\mu$H or less; about 1 millihenry (mH) or less; about 5 mH or less; about 10 mH or less; about 50 mH or less; about 100 mH or less; or about 500 mH or less. In embodiments, the inductance value of the inductor module 120 may range: from about 1 nH to about 500 mH; from about 1 nH to about 500 $\mu$H; or from about 1 nH to about 500 nH.

In embodiments, each of the floating inductor modules 130 may include one or more inductive elements that provide a fixed first inductance value. In other embodiments, each floating inductor modules 130 includes at least one inductive element and at least one switching element capable of selectively coupling the inductive elements to provide a defined second inductance value. In some embodiments, each floating inductor module 130 may include a plurality of inductive elements and a plurality of switching elements such that any one of a plurality of second inductance values may be achieved. In some embodiments, each floating inductor module 130 may include the same or similar plurality of inductive elements, thus each of floating inductor modules 130 may produce the same range of inductive values (e.g., $L_5$ to $L_6$). In some embodiments, one or more floating inductor modules 130 may include a first plurality of inductive elements capable of producing inductance values in a first inductance range, from (e.g., $L_5$ to $L_6$), while a second portion of the one or more floating inductor modules 130 may include a second plurality of inductive elements capable of producing inductance values in a second inductance range, from (e.g., $L_7$ to $L_8$). In some implementations, the second inductance range may overlap a portion of the first inductance range. In some implementations the second inductance range may no overlap a portion of the first inductance range.

The inductive elements included in each floating inductor module 130 may have the same or different construction and/or inductance. In embodiments, the inductive elements forming each inductor module 120 may be disposed in whole or in part in the semiconductor package substrate. In embodiments, the inductive elements included in each floating inductor module 130 may be communicably coupled to or detached from the load 110 based on the position or mode of the switching elements included in the floating inductor module 130. In embodiments, the inductive elements included in each floating inductor module 130 may be coupled in any series, parallel, or series/parallel combination. The inductive elements included in each floating inductor module 130 may have an individual inductance of: about 1 nanohenry (nH) or less; about 5 nH or less; about 10 nH or less; about 50 nH or less; about 100 nH or less; about 500 nH or less; about 1 microhenry (µH) or less; about 10 µH or less; about 50 µH or less; about 100 µH or less; about 500 µH or less; about 1 millihenry (mH) or less; about 5 mH or less; about 10 mH or less; about 50 mH or less; about 100 mH or less; or about 500 mH or less. In embodiments, the inductance value of the floating inductor module 130 may range: from about 1 nH to about 500 mH; from about 1 nH to about 500 µH; or from about 1 nH to about 500 nH.

The control circuitry 150 communicably couples to each of the loads 110, each of the inductor modules 120, the floating inductor modules 130, and the switching elements 160. In some embodiments, the inductor module 120 has a fixed inductance value and is conductively coupled to the load 110. In other embodiments, the inductor module 120 may have a variable inductance generated by selectively coupling a plurality of inductive elements within the inductor module 120 such that the connected inductive elements provide the desired inductance value. In such embodiments, the control circuit 150 may monitor the current drawn by the load 110 on a continuous, intermittent, periodic, or aperiodic basis. Based, at least in part on the current drawn by the load 110, the control circuit 150 determines a desired inductance value and selectively couples or decouples inductive elements in the inductor module 120 to provide the desired inductance value.

The control circuitry 150 monitors the current drawn by each of the loads 110. When the current drawn by a load 110 exceeds a defined allowable current threshold, the control circuitry 150, using one or more switching devices 160 may conductively couple a floating inductor module 130 to the respective load 110. In some embodiments, the floating inductor module 130 may have a fixed inductance value. In some embodiments, the floating inductor module 130 may have a variable inductance value. In such instances, the control circuit may selectively couple the inductive elements included in the floating inductor module to provide a desired inductor value.

In embodiments where the inductor module 120 has a fixed inductance value, in response to a current draw by a load 110 that is less than or below a defined allowable current threshold, the control circuitry 150 may do nothing. In embodiments where the adjustable inductor 120 has a variable inductance value, in response to a current draw by a load that is less than or below a defined allowable current threshold, the control circuitry 150 may determine a defined inductance value based at least in part on the current drawn by the load and may selectively adjust the inductance of the inductor module such that a combination of inductive elements in the inductor module 130 provides the desired inductance value.

In embodiments where the current drawn by a load 110 exceeds the allowable current threshold of the inductor module 120, the control circuit 150 causes the conductive coupling of a floating inductor module 130 to the respective load 110. In embodiments where the floating inductor module 130 has a fixed inductance value, in response to a current draw by a load 110 that is greater than a defined allowable current threshold, the control circuitry 150 may cause the conductive coupling of the floating inductor module 130 to the respective load 110. In embodiments where the floating inductor module 130 has a variable inductance value, in response to a current draw by a load that is greater than or above a defined allowable current threshold, the control circuitry 150 may determine a defined inductance value based at least in part on the current drawn by the load and may selectively adjust the inductance of the floating inductor module 130 such that a combination of inductive elements in the inductor module 130 provides the desired inductance value.

The switching elements 160 include any number and/or combination of devices and/or systems capable of conductively coupling and decoupling the floating inductor module 130 from one of the plurality of loads 110A-110n. In embodiments, the switching elements 160 may include electrical, electro-mechanical, or semiconductor switching devices. In embodiments, the switching elements 160 may include low-loss switching elements having a low resistance to current flow. In embodiments, the switching elements 160 may be communicably coupled to the control circuit 150 such that the control circuit determines the position and/or state of the switching device 160. In operation, the control circuit 150 positions each of the switching elements 160 such that each of the floating inductor modules 130 is either communicably coupled to a respective load 110 for which the current draw exceeds the allowable current threshold of the inductor module 120 coupled to the respective load.

For example, when the current draw by a load 110 exceeds the allowable current threshold, the control circuit 150 may cause the switching elements 160 to conductively couple the floating inductor module 130 in parallel with the inductor module 120 conductively coupled to the respective load. Such an arrangement beneficially reduces the current flow through the inductor module 120 to a level below the allowable current threshold.

In some implementations, the control circuit 150 may couple a floating inductor module 130 to a load 110 having a current draw at or below a second allowable current threshold. The second allowable current threshold is less than the first allowable current threshold. Such a system beneficially increases the inductance value for a load 110 operating at a very low current draw. In such an embodiment, the control circuit 150 may cause the switching elements 160 to conductively couple the floating inductor module 130 in electrical series with the inductor module 120 to effectively increase the inductance of the circuit feeding the respective load 110.

Figure 2A:
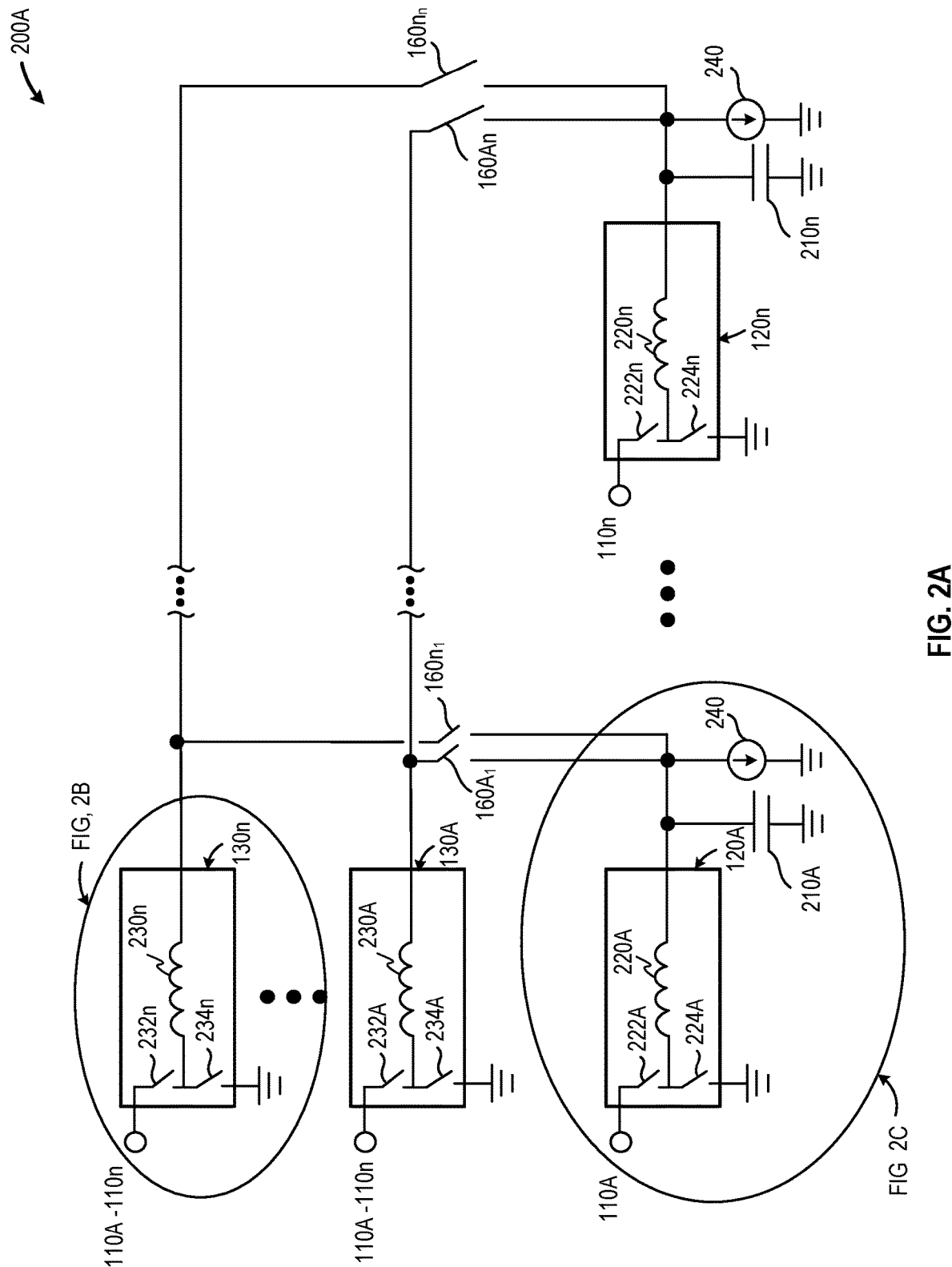
FIG. 2A is a schematic diagram of an illustrative system depicting a plurality of inductor modules and a plurality of floating inductor modules that may be conductively coupled to any of the inductor modules via one of a plurality of switches, in accordance with at least one embodiment described herein.
Figure 2B:
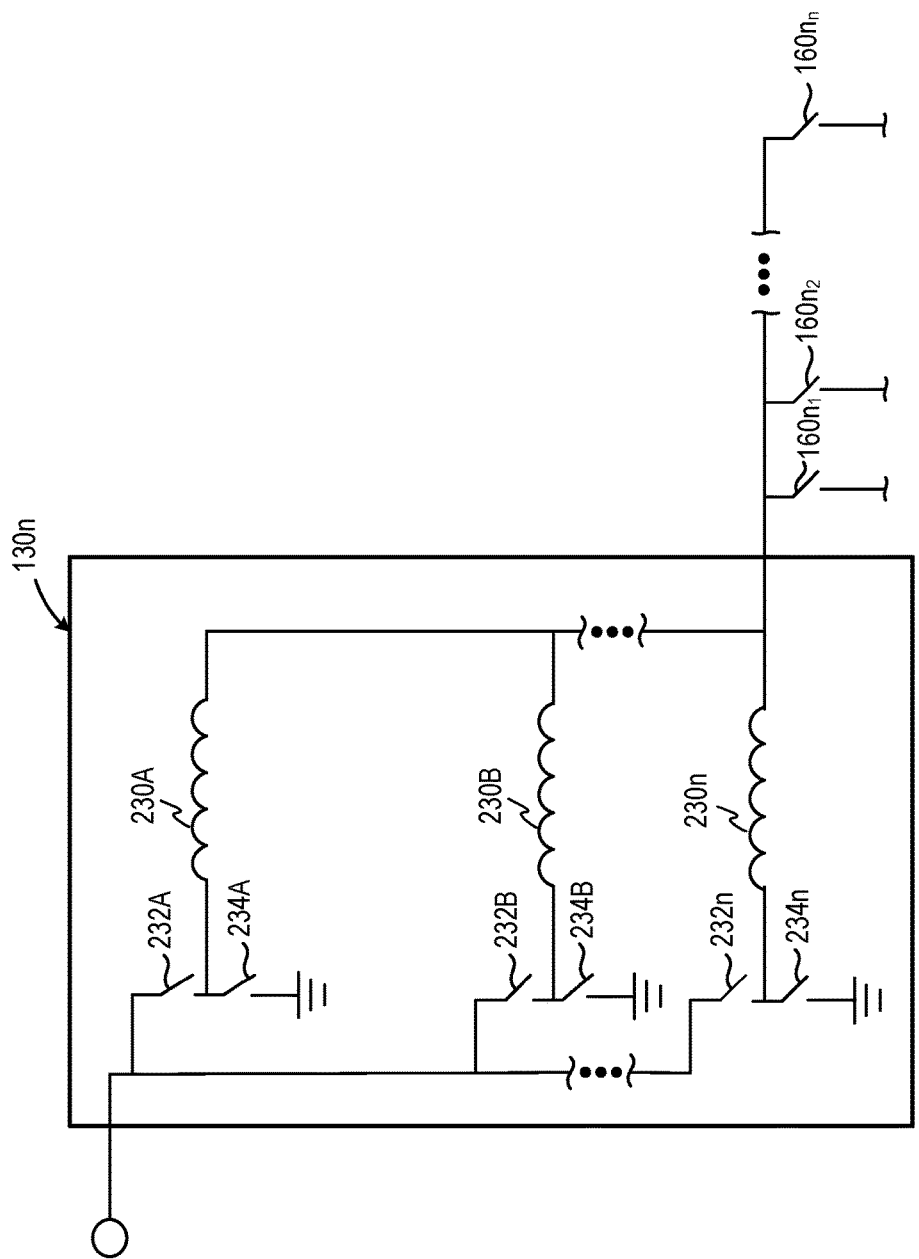
FIG. 2B is a schematic diagram of an illustrative floating inductor module such as depicted in FIG. 2A, in accordance with at least one embodiment described herein.
Figure 2C:
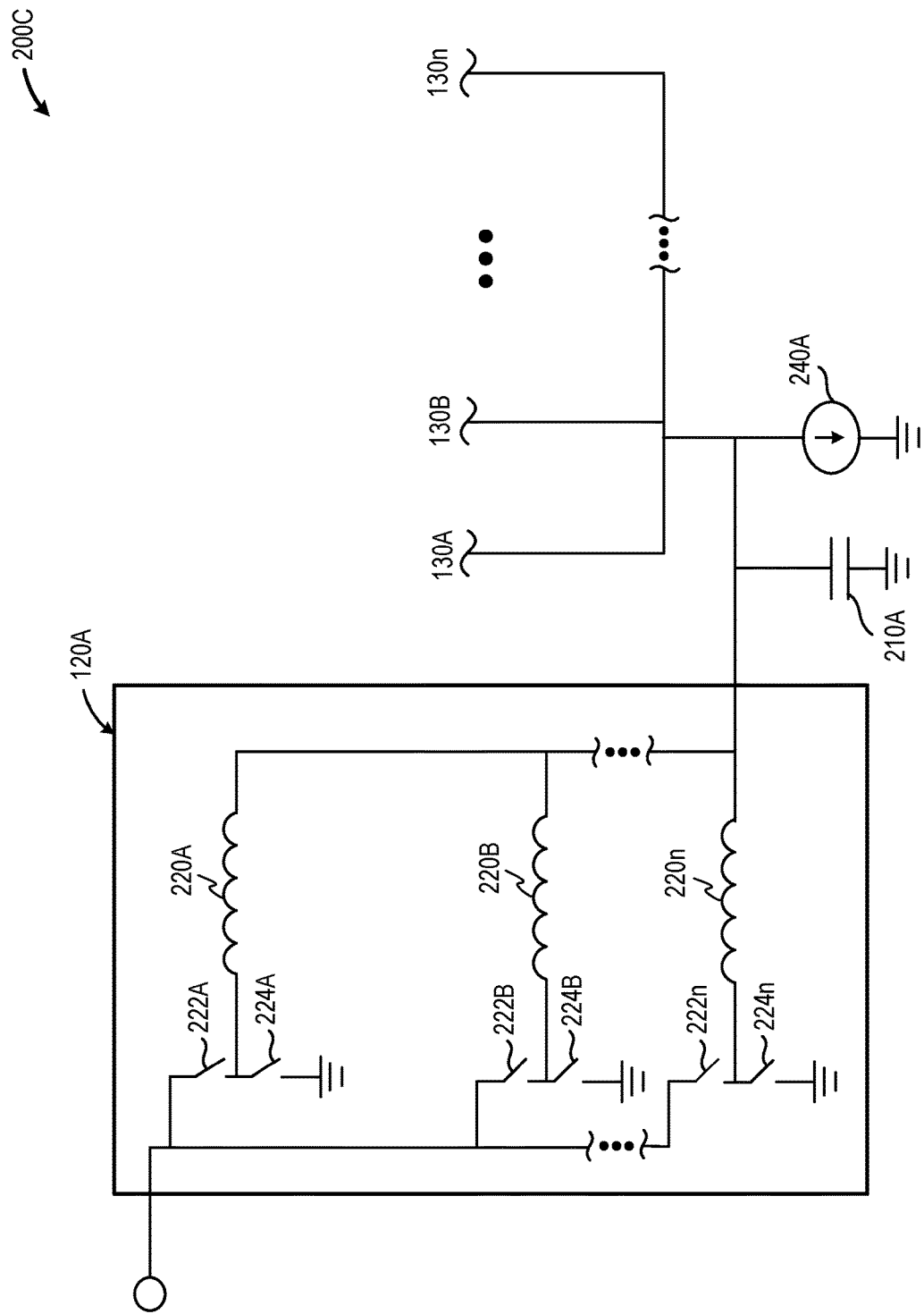
FIG. 2C is a schematic diagram of an illustrative inductor module such as depicted in FIG. 2A, in accordance with at least one embodiment described herein.
Figure 2D:
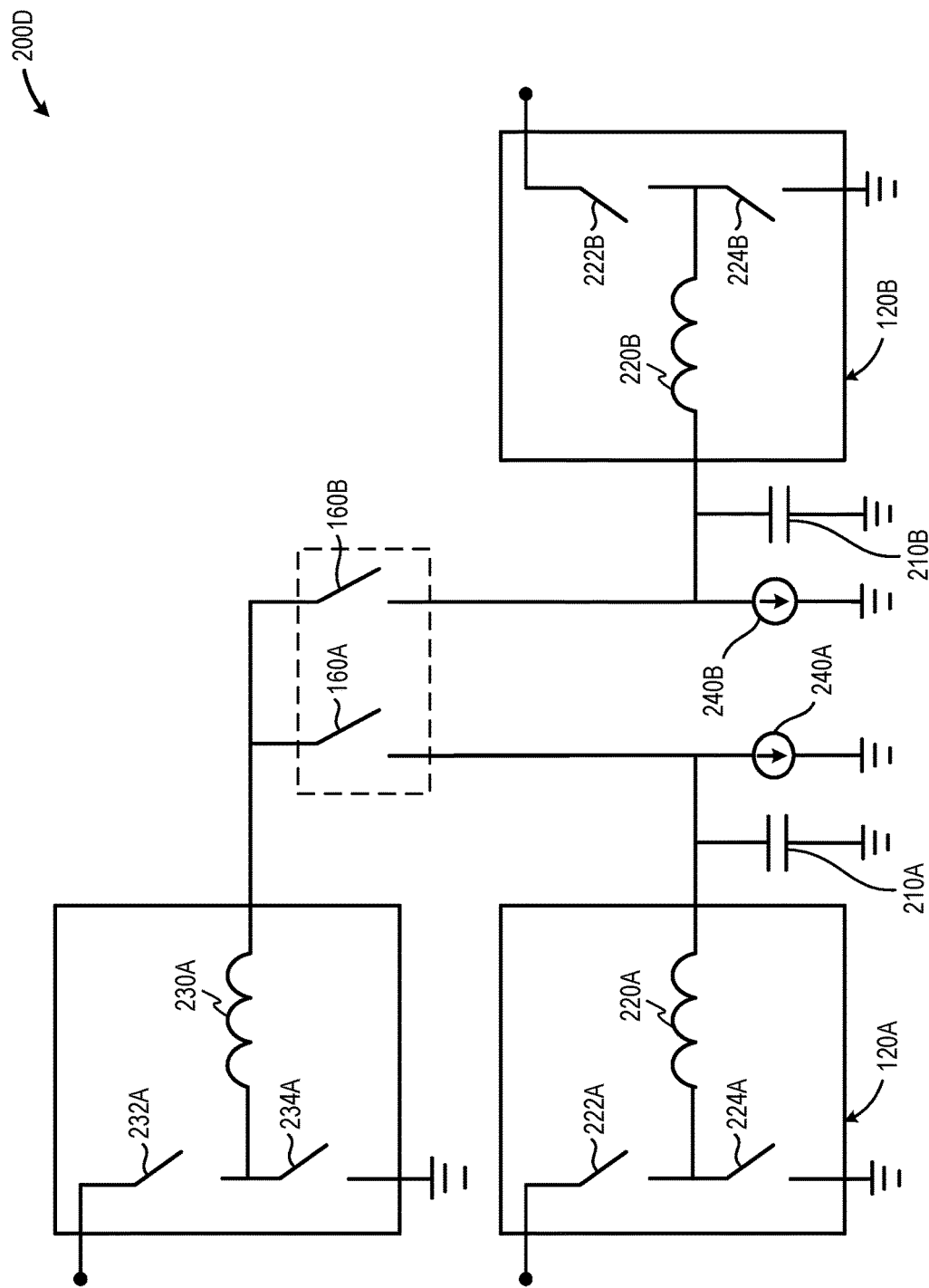
FIG. 2D is a schematic diagram of an illustrative system that includes two inductor modules such as depicted in FIG. 2C and a floating inductor module such as depicted in FIG. 2B that may be selectively conductively coupled to and decoupled from either of the two inductor modules, in accordance with at least one embodiment described herein.

FIG. 2A is a schematic diagram of an illustrative system 200 depicting a plurality of inductor modules 120A-120n and a plurality of floating inductor modules 130A-130n that may be conductively coupled to any of the inductor modules 120 via one of a plurality of switches 160A-160n, in accordance with at least one embodiment described herein. FIG. 2B is a schematic diagram of an illustrative floating inductor module 130 such as depicted in FIG. 2A, in accordance with at least one embodiment described herein. FIG. 2C is a schematic diagram of an illustrative inductor module 120 such as depicted in FIG. 2A, in accordance with at least one embodiment described herein. FIG. 2D is a schematic diagram of another illustrative embodiment that includes two inductor modules 120A and 120B and a single floating inductor module 130A that may be coupled to either of inductor modules 120A and 120B, in accordance with at least one embodiment described herein. The systems described in any or all of FIGS. 2A-2D may form at least a portion of a multiphase buck converter, buck regulator, or similar power converter. Example applications may include, but are not limited to a switched mode power supply used to provide power to various systems included in wearable processor-based devices, handheld processor-based devices, laptop processor-based devices, desktop processor-based devices, rack-mounted processor-based devices, and similar.

Referring first to FIG. 2A, each of the plurality of inductor modules 120 includes a number of inductive elements 220, one or more switching elements 222 that couple the inductive element 220 to a respective one of the loads 110, and one or more switching elements 224 that couple the inductive element 220 to ground. Each of the inductor modules 120 is coupled to one or more capacitive elements 210 to form an LC filtering circuit coupled to the load 110. A plurality of switching elements 160 may be used to conductively couple any of the floating inductor modules 130 to one of the inductor modules 120. In embodiments, the control circuit 150 may control the position, state, and/or mode of the switching elements 222 and 224 in each of the inductor modules 120 and/or the switching elements 160 that conductively couple the floating inductor modules 130 to the inductor modules 120.

Each of the plurality of floating inductor modules 130 includes a plurality of inductive elements 230, a corresponding plurality of switching elements 232 that couple the inductive elements 230 to the load 110, and a corresponding plurality of switching elements 232 that couple the inductive element 230 to ground. When coupled to a load 110, the floating inductor module 130 and the inductor module 120 when conductively coupled to the one or more capacitive elements 210 form an LC filtering circuit coupled to the load 110. In embodiments, the control circuit 150 may control the position, state, and/or mode of the switching elements 232 and 234 in each of the inductor modules 120 and/or the switching elements 160 that conductively couple the floating inductor modules 130 to the inductor modules 120.

Referring now to FIG. 2B, each of the floating inductor modules 130n includes a plurality of inductive elements 230A-230n (collectively, "inductive elements 230"). Each of these inductive elements 230 is selectively coupleable to the load 110 via a corresponding plurality of switching elements 232A-232n. Each of the inductive elements 230 is coupleable to ground via a corresponding plurality of switching elements 234A-234n. Each of the floating inductor modules 130n is conductively couplable to one of the inductor modules 120A-120n via switching elements 160$n_1$-160$n_n$. The inductive elements 230 included in each floating inductor module 130 may have an individual inductance of: about 1 nanohenry (nH) or less; about 5 nH or less; about 10 nH or less; about 50 nH or less; about 100 nH or less; about 500 nH or less; about 1 microhenry (μH) or less; about 10 μH or less; about 50 μH or less; about 100 μH or less; about 500 μH or less; about 1 millihenry (mH) or less; about 5 mH or less; about 10 mH or less; about 50 mH or less; about 100 mH or less; or about 500 mH or less.

In embodiments, the inductive elements 230 included in the floating inductor module 130 may include, but are not limited to, inductive elements formed, patterned, or otherwise disposed in, on, or about a semiconductor substrate of a stacked-die semiconductor package. Such inductive elements 230 may include, but are not limited to helical coil inductors, planar inductors, or any other type or configuration of an inductor that can be incorporated into a single or multi-layer substrate, such as a printed circuit board. Such inductive elements 230 may include, any number and/or combination of air-core inductors, magnetic core inductors, or inductors at least partially encapsulated in a magnetic material or composite magnetic material (e.g., non-electrically conductive magnetic particles suspended in a non-electrically conductive, curable carrier medium). The inductive elements 230 may be formed using any electrically conductive material including, but not limited to, copper, alloys containing copper, aluminum, and alloys containing aluminum.

The switching elements 232 and 234 may include any type or combination of systems and/or devices capable of providing an electrically continuous path between the inductive element 230 and the load (i.e., switching element 232) and an electrically continuous path between the inductive element 230 and ground (i.e., switching element 234). In embodiments, the switching elements 232 and 234 may be formed, patterned, or otherwise disposed in, on, or about the substrate containing the inductive elements 230. In other embodiments, the switching elements 232 and 234 may be formed in a semiconductor die conductively coupled to the substrate containing the inductive elements 230.

In embodiments, the control circuitry 150 may selectively configure the switching elements 232 and 234 to provide a series, parallel, or series/parallel circuit containing some or all of the inductive elements 230 included in the floating inductor module 130. Such beneficially and advantageously permits the control circuit 150 to selectively couple inductive elements 230 in a manner providing a defined inductance value. In embodiments, the defined inductance value may be based, at least in part, on the current drawn by the load 110.

Referring now to FIG. 2C, each of the inductor modules 120n includes a plurality of inductive elements 220A-220n (collectively, "inductive elements 220"). Each of these inductive elements 220 is selectively coupleable to the load 110 via a corresponding plurality of switching elements 222A-222n. Each of the inductive elements 220 is coupleable to ground via a corresponding plurality of switching elements 224A-224n. The inductive elements 220 included in each inductor module 120 may have an individual inductance of: about 1 nanohenry (nH) or less; about 5 nH or less; about 10 nH or less; about 50 nH or less; about 100 nH or less; about 500 nH or less; about 1 microhenry (μH) or less; about 10 μH or less; about 50 μH or less; about 100 μH or less; about 500 μH or less; about 1 millihenry (mH) or less; about 5 mH or less; about 10 mH or less; about 50 mH or less; about 100 mH or less; or about 500 mH or less.

In embodiments, the inductive elements 220 included in the inductor module 120 may include, but are not limited to, inductive elements formed, patterned, or otherwise disposed in, on, or about a semiconductor substrate of a stacked-die semiconductor package. Such inductive elements 220 may include, but are not limited to helical coil inductors, planar inductors, or any other type or configuration of an inductor that can be incorporated into a single or multi-layer substrate, such as a printed circuit board. Such inductive elements 220 may include, any number and/or combination of air-core inductors, magnetic core inductors, or inductors at least partially encapsulated in a magnetic material or composite magnetic material (e.g., non-electrically conductive magnetic particles suspended in a non-electrically conductive, curable carrier medium). The inductive elements 220 may be formed using any electrically conductive material including, but not limited to, copper, alloys containing copper, aluminum, and alloys containing aluminum.

The switching elements 222 and 224 may include any type or combination of systems and/or devices capable of providing an electrically continuous path between the inductive element 220 and the load (i.e., switching element 222) and an electrically continuous path between the inductive element 220 and ground (i.e., switching element 224). In embodiments, the switching elements 222 and 224 may be formed, patterned, or otherwise disposed in, on, or about the substrate containing the inductive elements 240. In other embodiments, the switching elements 222 and 224 may be formed in a semiconductor die conductively coupled to the substrate containing the inductive elements 220.

In embodiments, the control circuitry 150 may selectively configure the switching elements 222 and 224 to provide a series, parallel, or series/parallel circuit containing some or all of the inductive elements 220 included in the inductor module 120. Such beneficially and advantageously permits the control circuit 150 to selectively couple inductive elements 220 to provide a defined inductance value. In embodiments, the defined inductance value may be based, at least in part, on the current drawn by the load 110.

One or more capacitive elements 210 may be coupled in series with the inductive elements 220 in the inductor module 120 and, at times, with the inductive elements 230 in the floating inductor module 130. Conductively coupling the capacitive elements 210 with the inductive elements 220 and 230 creates an LC filter for the current supplied by one or more current sources 220 to the load 110.

Referring now to FIG. 2D, there is provided an illustrative embodiment 200D that includes two inductor modules 120A and 120B and a single floating inductor module 130A that may be selectively conductively coupled to either of the inductor modules 120A or 120B using switch elements 160A and 160B, respectively.

Figure 3:
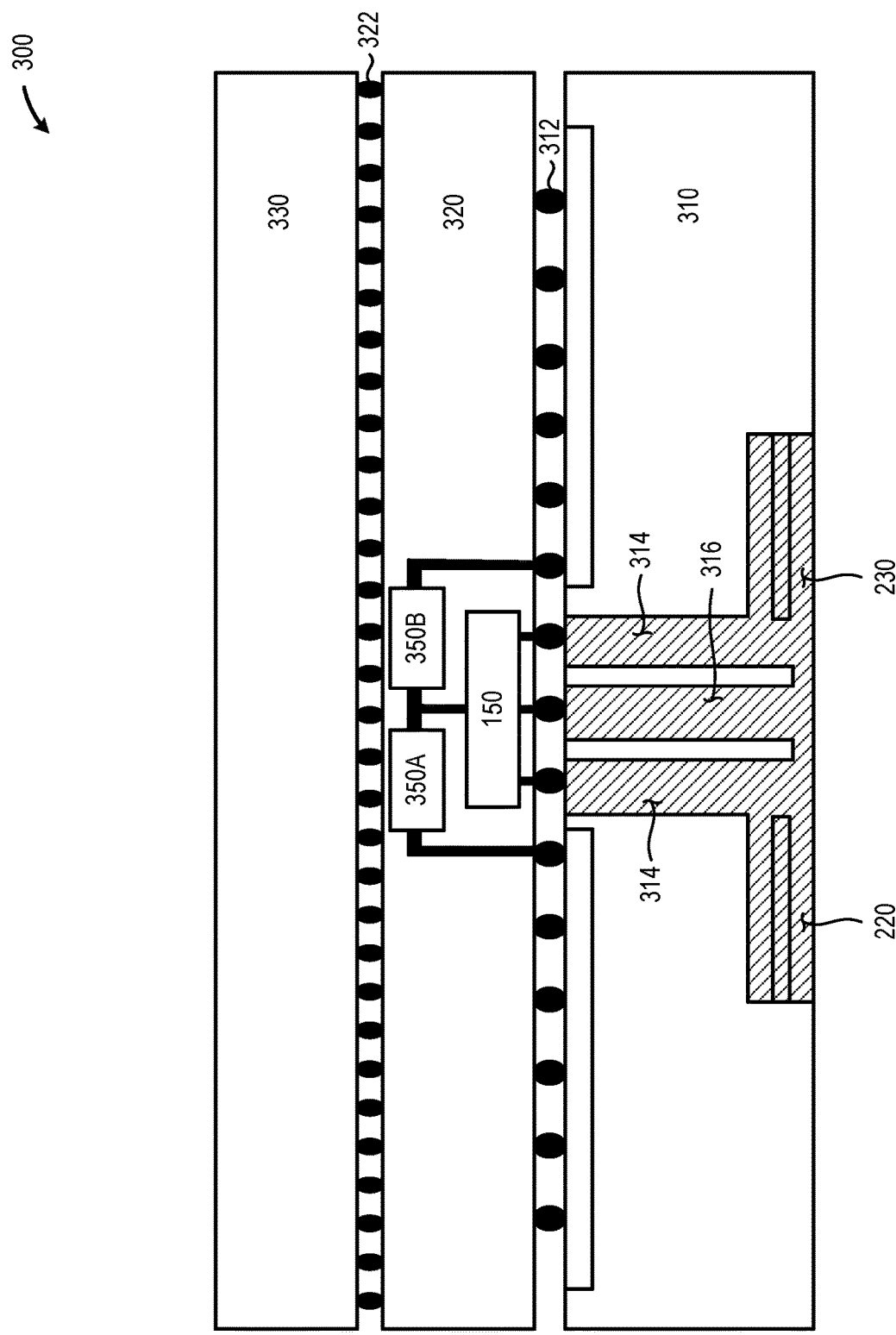
FIG. 3 is a cross-sectional elevation of an illustrative embodiment of an illustrative stacked-die semiconductor package in which the inductive elements and switching elements forming the inductor modules and the floating inductor modules have been distributed between a substrate and an interposer die disposed between the substrate and a semiconductor die, in accordance with at least one embodiment described herein.

FIG. 3 is a cross-sectional elevation of an illustrative embodiment of an illustrative stacked-die semiconductor package 300 in which the inductive elements and switching elements forming the inductor modules 120 and the floating inductor modules 130 have been distributed between a substrate 310 and an interposer die 320 disposed between the substrate 310 and a semiconductor die 330, in accordance with at least one embodiment described herein. As depicted in FIG. 3, the inductor module inductive elements 220 and the floating inductor module inductive elements 230 may be patterned, formed, deposited, or otherwise disposed in a portion of a substrate 310. One or more switching networks 350A, 350B (collectively, "switching networks 350"), incorporating some or all of switchable elements 222, switchable elements 224, switchable elements 232, switchable elements 234, and switchable elements 160, may be patterned, formed, deposited, or otherwise disposed in an interposer die layer 320. All or a portion of the control circuit 150 may also be patterned, formed, deposited, or otherwise disposed in the interposer die layer 320. A plurality of interconnects 312A-312n communicably couple the switching networks 350 and the control circuit 150 to inductive elements 220 and inductive elements 230 in the substrate 310.

In embodiments one or more semiconductor dies 330 may be disposed proximate the interposer die 320 containing the switching networks 350 and/or the control circuit 150. Although not depicted in FIG. 3, in some embodiments, all or a portion of the control circuit 150 may be disposed in, on, or about the one or more semiconductor dies 330. In embodiments, the semiconductor die 330 may include a central processing unit (CPU) semiconductor die. In embodiments, the semiconductor die 330 may include a multi-core CPU, with each processor core representing one load 110. In such embodiments, the control circuit 150 may monitor the current flow to each of the CPU cores (i.e., loads 110) and may adjust, position, set, or otherwise control the switching elements in the switching networks 350 responsive to the measured current drawn by each of the CPU cores.

For example, the control circuitry 150 may couple a floating inductor module 130 in parallel with the inductor module 120 coupled to a CPU core responsive to detecting a current draw by the CPU core that exceeds a defined first current threshold. In another example, the control circuitry 150 may couple inductive elements 220 in series to increase the inductance value of an inductor module 120 responsive to detecting a current draw by the CPU core coupled to the inductor module 120 that is below a defined second current threshold.

Figure 4:
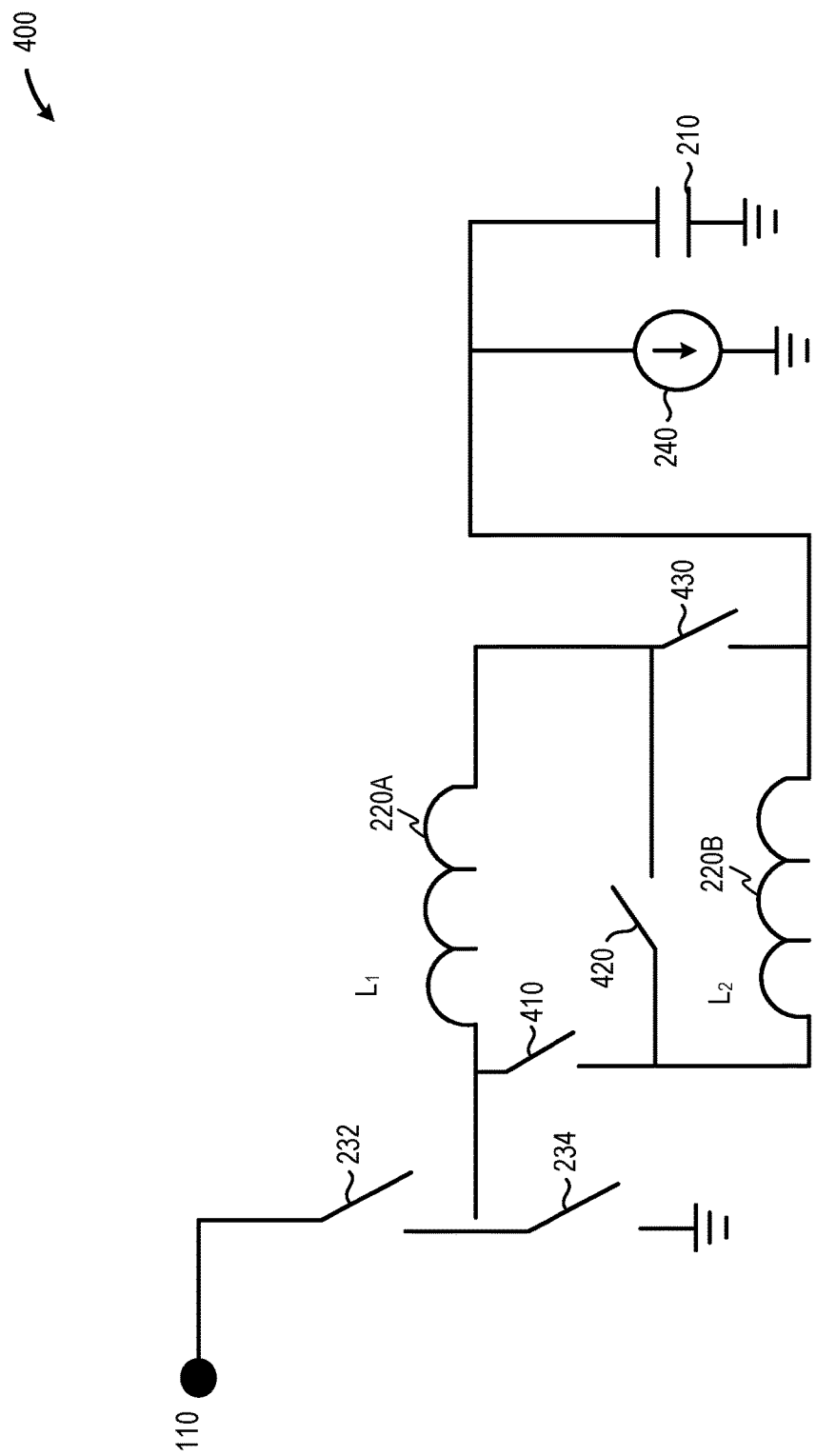
FIG. 4 is an example LC circuit that may be formed by the control circuit using inductive elements and switching elements disposed or otherwise formed in, on, or about an example inductor module, in accordance with at least one embodiment described herein.

FIG. 4 is an example LC circuit 400 that may be formed by the control circuit 150 using inductive elements 220A and 220B and switching elements 410, 420, and 430 disposed or otherwise formed in, on, or about an example inductor module 120, in accordance with at least one embodiment described herein. As depicted in FIG. 4, up to five different inductance values are possible using inductive elements 220A and 220B and switching elements 410, 420, and 430. If switching elements 410, 420, and 430 are closed at the same time, an inductance value of "0" occurs since the load 110 is shorted directly to source 240. If switching elements 410 and 420 are open and switching element 430 is closed, an inductance value of "$L_1$" is placed in series with the load 110. If switching elements 420 and 430 are open and switching element 410 is closed, an inductance value of "$L_2$" is placed in series with the load 110. If switching elements 410 and 430 are closed and switching element 420 is open, an inductance value of "$(L_1*L_2/(L_1+L_2))$" is placed in series with the load 110. If switching elements 410 and 430 are open and switching element 420 is closed, an inductance value of "$L_1+L_2$" is placed in series with the load 110.

Figure 5:
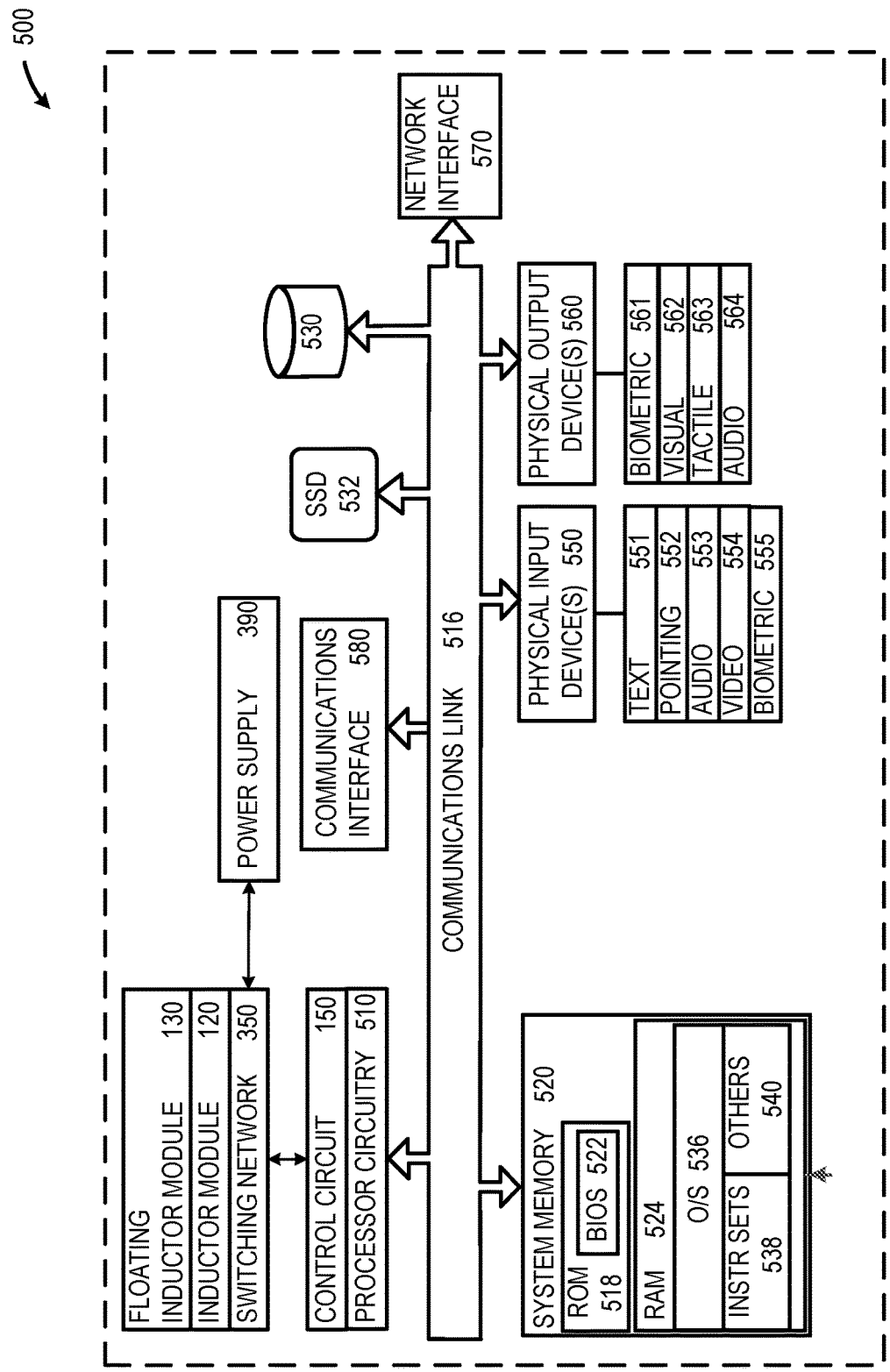
FIG. 5 is a block diagram of an illustrative processor-based device equipped with processor circuitry having one or more cores, where each core (i.e., load) within the processor circuitry is coupled to an inductor module as described in FIGS. 1 through 4 above and in accordance with at least one embodiment described herein.

FIG. 5 is a block diagram of an illustrative processor-based device 500 equipped with processor circuitry 510 having one or more cores, where each core (i.e., load 110) within the processor circuitry 510 is coupled to an inductor module 120 as described in FIGS. 1 through 4 above and in accordance with at least one embodiment described herein. The following discussion provides a brief, general description of the components forming the illustrative processor-based device 500 such as a smartphone, wearable computing device, portable computing device, or any similar device having a control circuit 150 that selectively provides an autonomously adjustable inductance on each power rail that connects the device power supply 590 with a respective processor core in the processor circuitry 510. In embodiments, the control circuit 150 may adjust the inductance value of an inductor module 120 that forms an LC circuit coupled to the core. In embodiments, the control circuit 150 may adjust the inductance value of an inductor module 120 and a floating inductor module 130 that form an LC circuit coupled to the core.

The processor-based device 500 includes processor circuitry 510 capable of executing machine-readable instruction sets, reading data from a storage device 530 and writing data to the storage device 530. Those skilled in the relevant art will appreciate that the illustrated embodiments as well as other embodiments can be practiced with other circuit-based device configurations, including portable electronic or handheld electronic devices, for instance smartphones, portable computers, wearable computers, microprocessor-based or programmable consumer electronics, personal computers ("PCs"), network PCs, minicomputers, mainframe computers, and the like.

The processor circuitry 510 may include any number of hardwired or configurable circuits, some or all of which may include programmable and/or configurable combinations of electronic components, semiconductor devices, and/or logic elements that are disposed partially or wholly in a PC, server, or other computing system capable of executing machine-readable instructions. In embodiments, the processor circuitry 510 may provide all or a portion of the control circuit 150. In other embodiments, the control circuit 150 may be disposed in whole or in part in a separate semiconductor die, such as an interposer die 320 disposed between a substrate 310 and a CPU die 330 that includes the processor circuitry 510.

The processor-based device 500 includes the processor circuitry 510 and bus or similar communications link 516 that communicably couples and facilitates the exchange of information and/or data between various system components including a system memory 520, one or more rotating data storage devices 530, and/or one or more solid state storage devices 532. The processor-based device 500 may be referred to in the singular herein, but this is not intended to limit the embodiments to a single device and/or system, since in certain embodiments, there will be more than one processor-based device 500 that incorporates, includes, or contains any number of communicably coupled, collocated, or remote networked circuits or devices.

The processor circuitry 510 may include any number, type, or combination of devices. At times, the processor circuitry 510 may be implemented in whole or in part in the form of semiconductor devices such as diodes, transistors, inductors, capacitors, and resistors. Such an implementation may include, but is not limited to any current or future developed single- or multi-core processor or microprocessor, such as: on or more systems on a chip (SOCs); central processing units (CPUs); digital signal processors (DSPs); graphics processing units (GPUs); application-specific integrated circuits (ASICs), programmable logic units, field programmable gate arrays (FPGAs), and the like. Unless described otherwise, the construction and operation of the various blocks shown in FIG. 5 are of conventional design. Consequently, such blocks need not be described in further detail herein, as they will be understood by those skilled in the relevant art. The communications link 516 that interconnects at least some of the components of the processor-based device 500 may employ any known serial or parallel bus structures or architectures.

The system memory 520 may include read-only memory ("ROM") 518 and random access memory ("RAM") 524. A portion of the ROM 518 may be used to store or otherwise retain a basic input/output system ("BIOS") 522. The BIOS 522 provides basic functionality to the processor-based device 500, for example by causing the processor circuitry 510 to load one or more machine-readable instruction sets. In embodiments, at least some of the one or more machine-readable instruction sets cause at least a portion of the processor circuitry 510 to provide, create, produce, transition, and/or function as a dedicated, specific, and particular machine, for example a word processing machine, a digital image acquisition machine, a media playing machine, a communications device, and similar.

The processor-based device 500 may include one or more communicably coupled, non-transitory, data storage devices, such as one or more hard disk drives 530 and/or one or more solid-state storage devices 532. The one or more data storage devices 530 may include any current or future developed storage appliances, networks, and/or devices. Non-limiting examples of such data storage devices 530 may include, but are not limited to, any current or future developed non-transitory storage appliances or devices, such as one or more magnetic storage devices, one or more optical storage devices, one or more electro-resistive storage devices, one or more molecular storage devices, one or more quantum storage devices, or various combinations thereof. In some implementations, the one or more data storage devices 530 may include one or more removable storage devices, such as one or more flash drives, flash memories, flash storage units, or similar appliances or devices capable of communicable coupling to and decoupling from the processor-based device 500.

The one or more data storage devices 530 and/or the one or more solid-state storage devices 532 may include interfaces or controllers (not shown) communicatively coupling the respective storage device or system to the communications link 516. The one or more data storage devices 530 may store, retain, or otherwise contain machine-readable instruction sets, data structures, program modules, data stores, databases, logical structures, and/or other data useful to the processor circuitry 510 and/or one or more applications executed on or by the processor circuitry 510. In some instances, one or more data storage devices 530 may be communicably coupled to the processor circuitry 510, for example via communications link 516 or via one or more wired communications interfaces (e.g., Universal Serial Bus or USB); one or more wireless communications interfaces (e.g., Bluetooth®, Near Field Communication or NFC); one or more wired network interfaces (e.g., IEEE 802.3 or Ethernet); and/or one or more wireless network interfaces (e.g., IEEE 802.11 or WiFi®).

Machine-readable instruction sets 538 and other programs, applications, logic sets, and/or modules 540 may be stored in whole or in part in the system memory 520. Such instruction sets 538 may be transferred, in whole or in part, from the one or more data storage devices 530 and/or the solid state storage device 532. The instruction sets 538 may be loaded, stored, or otherwise retained in system memory 520, in whole or in part, during execution by the processor circuitry 510. The machine-readable instruction sets 538 may include machine-readable and/or processor-readable code, instructions, or similar logic capable of providing the speech coaching functions and capabilities described herein.

A system user may provide, enter, or otherwise supply commands (e.g., selections, acknowledgements, confirmations, and similar) as well as information and/or data (e.g., subject identification information, color parameters) to the processor-based device 500 using one or more communicably coupled input devices 550. The one or more communicably coupled input devices 550 may be disposed local to or remote from the processor-based device 500. The input devices 550 may include one or more: text entry devices 551 (e.g., keyboard); pointing devices 552 (e.g., mouse, trackball, touchscreen); audio input devices 553; video input devices 554; and/or biometric input devices 555 (e.g., fingerprint scanner, facial recognition, iris print scanner, voice recognition circuitry). In embodiments, at least some of the one or more input devices 550 may include a wired or wireless interface that communicably couples the input device 550 to the processor-based device 500.

The system user may receive output from the processor-based device 500 via one or more output devices 560. In at least some implementations, the one or more output devices 560 may include, but are not limited to, one or more: biometric output devices 561; visual output or display devices 562; tactile output devices 563; audio output devices 564, or combinations thereof. In embodiments, at least some of the one or more output devices 560 may include a wired or a wireless communicable coupling to the processor-based device 502.

For convenience, a network interface 570, the processor circuitry 510, the system memory 520, the one or more input devices 550 and the one or more output devices 560 are illustrated as communicatively coupled to each other via the communications link 516, thereby providing connectivity between the above-described components. In alternative embodiments, the above-described components may be communicatively coupled in a different manner than illustrated in FIG. 5. For example, one or more of the above-described components may be directly coupled to other components, or may be coupled to each other, via one or more intermediary components (not shown). In some embodiments, all or a portion of the communications link 516 may be omitted and the components are coupled directly to each other using suitable wired or wireless connections.

Figure 6:
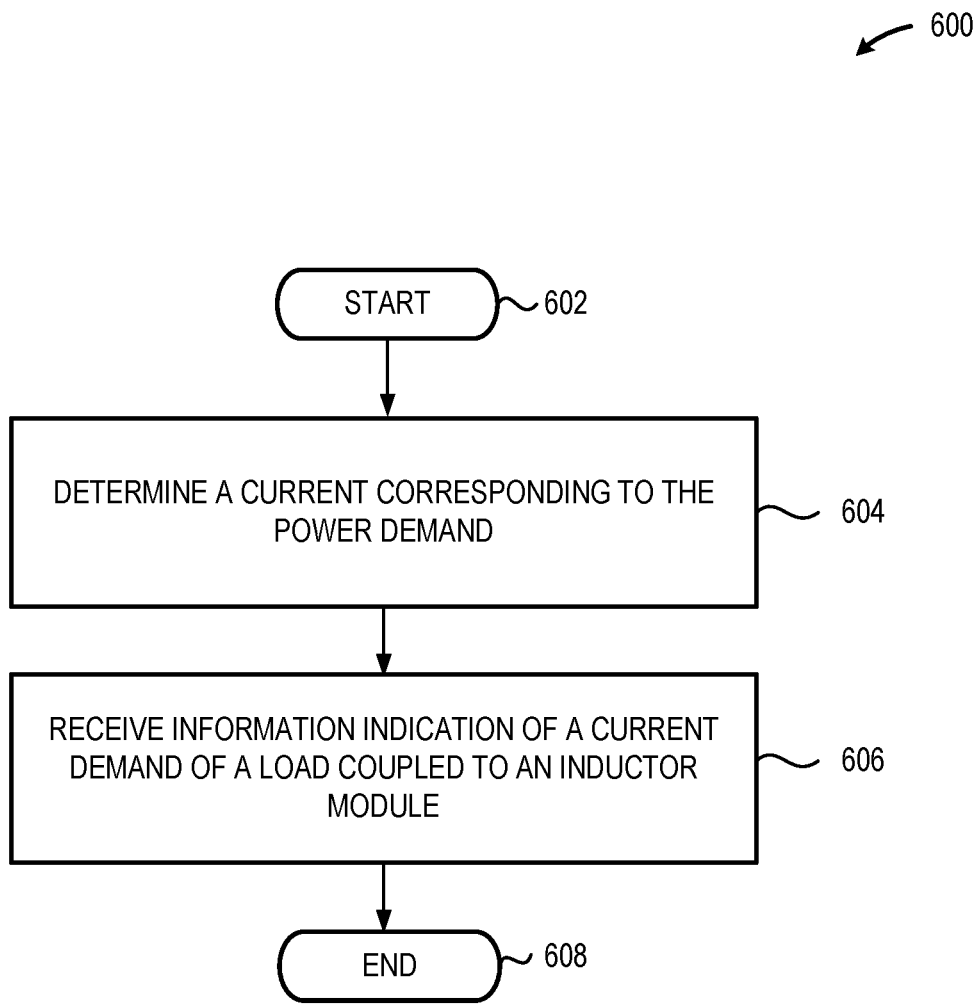
FIG. 6 is a high-level logic flow diagram of an illustrative method of determining whether a current demand exceeds an allowable current for an inductor module, in accordance with at least one embodiment described herein.

FIG. 6 is a high-level logic flow diagram of an illustrative method 600 of determining whether a current demand exceeds an allowable current for an inductor module 120, in accordance with at least one embodiment described herein. In embodiments, a power supply 590 may provide power to each of a plurality of loads 110A-110*n*. The current demand for each of the loads varies over time, and not all loads 110 will draw at a peak current demand simultaneously. The method 600 beneficially and advantageously permits a control circuit to determine an inductance based at least in part on the current demand exerted by a load 110. The method 600 commences at 602.

At 604, the control circuit 150 receives information indicative of a current demand exerted on a power supply 590 by a load 110. In embodiments, the current demand may be exerted by a processor core (i.e., the load 110) on a power rail conductively coupling the respective core to the power supply 590. In embodiments, the control circuit 150 may receive such power demand information on a continuous, intermittent, periodic, or aperiodic basis.

At 606, the control circuit 150 determines whether the current demand exerted by a load 110 exceeds a defined first allowable current threshold for the inductor module 120 conductively coupled to the respective load 110. In embodiments, the first allowable current threshold may be a fixed value. In embodiments, the first allowable current threshold may be a variable value based on one or more system operating parameters, such as system temperature. In embodiments, the first allowable current threshold may be based on an operating mode of one or more cores in a multi-core processor (e.g., an enhanced performance mode versus a standard operating mode). The method 600 concludes at 608.

Figure 7:
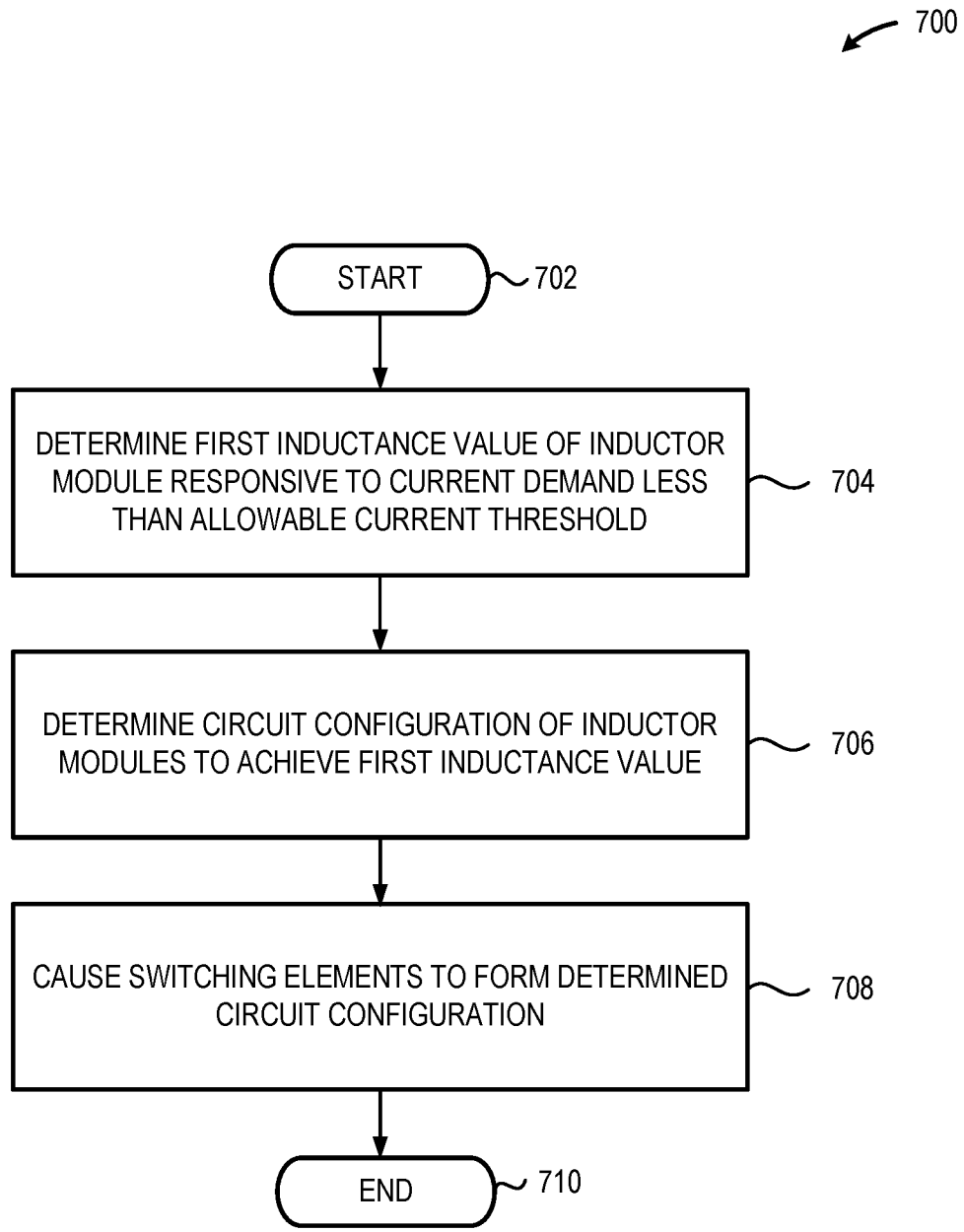
FIG. 7 is a high-level logic flow diagram of an illustrative method of determining an inductance value of an inductor module based, at least in part, on the current demand of the load conductively coupled to the inductor module, in accordance with at least one embodiment described herein.

FIG. 7 is a high-level logic flow diagram of an illustrative method 700 of determining an inductance value of an inductor module 120 based, at least in part, on the current demand of the load 110 conductively coupled to the inductor module 120, in accordance with at least one embodiment described herein. The method 700 may be used in conjunction with the method 600 disclosed above in FIG. 6. Where the current demand of the load 110 is below the first defined current threshold, the control circuit 150 may determine a first inductance value for the inductor module 120 using the current demand exerted by the load 110 on the power supply 590. The method 700 commences at 702.

At 704, responsive to the current demand of the load 110 being less than the first allowable current threshold, the control circuit 150 determines a first inductance value for the inductor module 120 using the current demand exerted by the load 110 on the power supply 590.

At 706, the control circuit 150 determines an inductor module circuit configuration that provides the determined first inductance value.

At 708, the control circuit 150 causes switching elements 232 and 234 to transition to states and/or positions that provide the first inductance value determined at 706. In embodiments, at least a portion of these switching elements may be disposed in, on, or about an interposer die disposed between a semiconductor package substrate and the lowermost semiconductor die in the semiconductor package. In some implementations, the switching elements 232 and 234 may include, but are not limited to semiconductor devices such as transistors or field effect transistors. In embodiments, the switching elements 232 and 234 may low loss switches having a relatively low resistance or reactance to the flow of current to the load 110. The method 700 concludes at 710.

Figure 8:
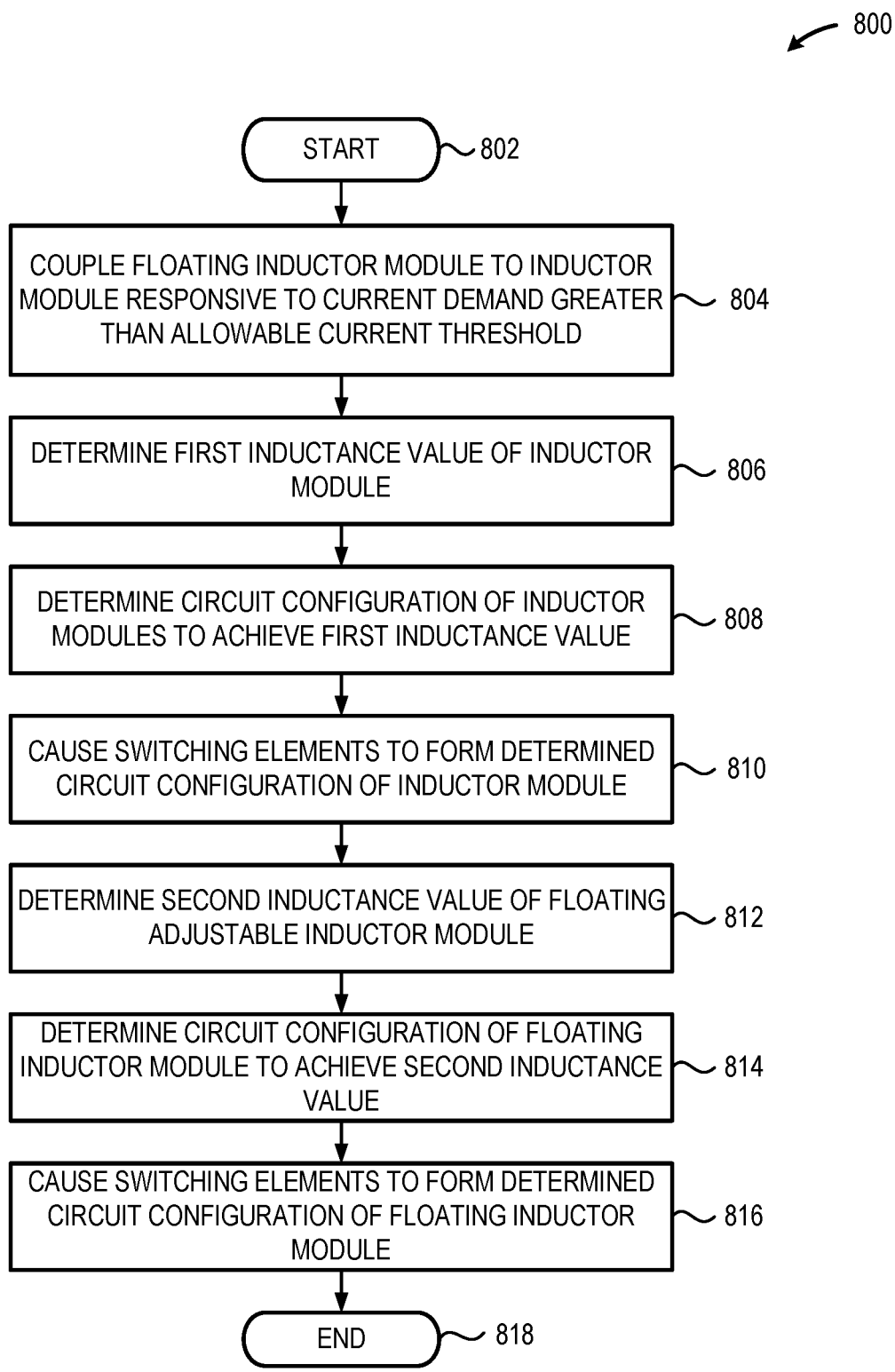
FIG. 8 is a high-level logic flow diagram of an illustrative method of determining an inductance value of an inductor module and an inductance value of a floating inductor module conductively coupled to the inductor module based, at least in part, on the current demand of the load, in accordance with at least one embodiment described herein.

FIG. 8 is a high-level logic flow diagram of an illustrative method 800 of determining an inductance value of an inductor module 120 and an inductance value of a floating inductor module 130 conductively coupled to the inductor module 120 based, at least in part, on the current demand of the load 110, in accordance with at least one embodiment described herein. The method 800 may be used in conjunction with the method 600 disclosed above in FIG. 6 and/or the method 700 disclosed above in FIG. 7. Where the current demand of the load 110 is greater than the first defined current threshold, the control circuit 150 may determine a first inductance value for the inductor module 120 and a second inductance value for the floating inductor module 130 using the current demand exerted by the load 110 on the power supply 590. For example, when a CPU core (i.e., a load 110) transitions from a first (standard) operating mode to a second (performance) operating mode. The method 800 commences at 802.

At 804, responsive to the current demand of the load 110 being greater than the first allowable current threshold, the control circuit 150 conductively couples a floating inductor module 130 in parallel with the inductor module 120 coupled to the load 110. In embodiments, the control circuit 150 may change the state or position of one or more switching elements 160 to place the floating inductor module 130 in parallel with the inductor module 120.

At 806, the control circuit 150 determines a first inductance value for the inductor module 120 using the current demand exerted by the load 110 on the power supply 590.

At 808, the control circuit 150 determines an inductor module circuit configuration that provides the determined first inductance value.

At 810, the control circuit 150 causes switching elements 232 and 234 to transition to states and/or positions that provide the first inductance value determined at 806. In embodiments, at least a portion of these switching elements may be disposed in, on, or about an interposer die disposed between a semiconductor package substrate and the lowermost semiconductor die in the semiconductor package. In some implementations, the switching elements 232 and 234 may include, but are not limited to semiconductor devices such as transistors or field effect transistors. In embodiments, the switching elements 232 and 234 may low loss switches having a relatively low resistance or reactance to the flow of current to the load 110.

At 812, the control circuit 150 determines a second inductance value for the floating inductor module 130 using the current demand exerted by the load 110 on the power supply 590.

At 814, the control circuit 150 determines a floating inductor module circuit configuration that provides the determined second inductance value.

At 816, the control circuit 150 causes switching elements 242 and 244 to transition to states and/or positions that provide the second inductance value determined at 812. In embodiments, at least a portion of these switching elements may be disposed in, on, or about an interposer die disposed between a semiconductor package substrate and the lowermost semiconductor die in the semiconductor package. In some implementations, the switching elements 242 and 244 may include, but are not limited to semiconductor devices such as transistors or field effect transistors. In embodiments, the switching elements 242 and 244 may low loss switches having a relatively low resistance or reactance to the flow of current to the load 110. The method 800 concludes at 818.

While FIGS. 6 through 8 illustrate various operations according to one or more embodiments, it is to be understood that not all of the operations depicted in FIGS. 6 through 8 are necessary for other embodiments. Indeed, it is fully contemplated herein that in other embodiments of the present disclosure, the operations depicted in FIGS. 6 through 8, and/or other operations described herein, may be combined in a manner not specifically shown in any of the drawings, but still fully consistent with the present disclosure. Thus, claims directed to features and/or operations that are not exactly shown in one drawing are deemed within the scope and content of the present disclosure.

As used in this application and in the claims, a list of items joined by the term "and/or" can mean any combination of the listed items. For example, the phrase "A, B and/or C" can mean A; B; C; A and B; A and C; B and C; or A, B and C. As used in this application and in the claims, a list of items joined by the term "at least one of" can mean any combination of the listed terms. For example, the phrases "at least one of A, B or C" can mean A; B; C; A and B; A and C; B and C; or A, B and C.

Any of the operations described herein may be implemented in a system that includes one or more mediums (e.g., non-transitory storage mediums) having stored therein, individually or in combination, instructions that when executed by one or more processors perform the methods. Here, the processor may include, for example, a server CPU, a mobile device CPU, and/or other programmable circuitry. Also, it is intended that operations described herein may be distributed across a plurality of physical devices, such as processing structures at more than one different physical location. The storage medium may include any type of tangible medium, for example, any type of disk including hard disks, floppy disks, optical disks, compact disk read-only memories (CD-ROMs), rewritable compact disks (CD-RWs), and magneto-optical disks, semiconductor devices such as read-only memories (ROMs), random access memories (RAMs) such as dynamic and static RAMs, erasable programmable read-only memories (EPROMs), electrically erasable programmable read-only memories (EEPROMs), flash memories, Solid State Disks (SSDs), embedded multimedia cards (eMMCs), secure digital input/output (SDIO) cards, magnetic or optical cards, or any type of media suitable for storing electronic instructions. Other embodiments may be implemented as software executed by a programmable control device.

Thus, the present disclosure is directed to a system that includes a plurality of inductor modules coupled to a corresponding plurality of loads and a pool of at least one floating inductor module that may be coupled in parallel with any one of the plurality of inductor modules. A control circuit monitors the current drawn through the inductor module by the load. If current draw exceeds a threshold, a floating inductor module is coupled to the load. Using the current drawn by the load, the control circuit determines an appropriate inductance value and determines an appropriate inductor configuration for the inductor module, the floating inductor module, or both the inductor module and the floating inductor module to achieve the inductance value. The control circuit causes switching elements to transition to a state or position to achieve the inductor configuration.

The following examples pertain to further embodiments. The following examples of the present disclosure may comprise subject material such as at least one device, a method, at least one machine-readable medium for storing instructions that when executed cause a machine to perform acts based on the method, means for performing acts based on the method and/or a system for adjusting the inductance coupled to a load based on the current draw of the load using an inductor modules and, if the current is greater than a defined threshold value, a floating inductor module. The inductor module and the floating inductor module each include one or more inductive elements formed in a semiconductor package substrate and a number of switching elements formed in an interposer die disposed between the semiconductor package substrate and the lowermost die in the semiconductor package.

According to example 1, there is provided a power delivery system. The power delivery system may include: a plurality of power delivery circuits, each of the circuits to supply a load current to a respective one of a plurality of conductively coupled loads; a plurality of inductor modules, each of the plurality of inductor modules having an allowable current threshold, each of the plurality of inductor modules conductively coupled to a respective one of the power delivery circuits; at least one floating inductor module, the at least one floating inductor module conductively couplable to any of the plurality of power delivery circuits; and control circuitry to: receive information indicative of the load current supplied to at least one power delivery circuit; receive information indicative of the allowable current threshold of the at least one power delivery circuit; and determine whether the load current supplied by the at least one power delivery circuit exceeds the allowable current threshold for the inductor module conductively coupled to the at least one power delivery circuit.

Example 2 may include elements of example 1 where each of the plurality of inductor modules comprises an inductor module formed in a semiconductor package substrate; where the at least one floating inductor module comprises at least one floating inductor module disposed in the semiconductor package substrate; where each of a plurality of switch elements selectively conductively couples the at least one floating inductor module to a respective one of the plurality of power delivery circuits.

Example 3 may include elements of any of examples 1 or 2 where the control circuitry, responsive to determining the load current supplied by the at least one power delivery circuit exceeds the allowable current threshold, to further: conductively couple the floating inductor module to the at least one power delivery circuit.

Example 4 may include elements of any of examples 1 through 3 where the plurality of conductively coupled loads comprise loads disposed in one or more semiconductor dies included in the semiconductor package; and where the plurality of switch elements include a plurality of semiconductor devices disposed in an interposer layer conductively coupled between the one or more semiconductor dies and the semiconductor package substrate.

Example 5 may include elements of any of examples 1 through 4 where the at least one floating inductor module comprises a floating inductor module having at least one of: a floating inductor module having a fixed inductance value; or a variable inductance floating inductor module having a selectively variable inductance value provided by a plurality of inductive elements conductively coupled to a second plurality of switch elements, each of the second plurality of switch elements conductively coupled to the control circuitry; and where each of the plurality of inductor modules comprises an inductor module having at least one of: an inductor module having a fixed inductance value; or a variable inductance inductor module having a selectively variable inductance value provided by a plurality of inductive elements conductively coupled to a third plurality of switches, each of the third plurality of switches conductively coupled to the control circuitry.

Example 6 may include elements of any of examples 1 through 5 where the interposer layer includes at least a portion of the control circuitry.

Example 7 may include elements of any of examples 1 through 6 where the second plurality of switch elements is disposed in the interposer layer; and where the third plurality of switch elements is disposed in the interposer layer.

Example 8 may include elements of any of examples 1 through 7 where the floating inductor module comprises a variable inductance floating inductor module; and where the control circuitry, responsive to determining the load current supplied by the at least one power delivery circuit exceeds the allowable current threshold, to further: determine an inductance value for the variable inductance floating inductor module using the load current supplied by the at least one power delivery circuit and the allowable current threshold for the inductor module conductively coupled to the at least one power delivery circuit; determine an inductor element configuration in the variable inductance floating inductor module to provide the determined inductance value; and cause the second plurality of switch elements to transition to a state to provide the inductor element configuration in the variable inductance floating inductor module.

Example 9 may include elements of any of examples 1 through 8 where the inductor module comprises a variable inductance inductor module; and where the control circuitry, responsive to determining the load current supplied by the at least one power delivery circuit is less than the allowable current threshold, to further: determine an inductance value for the variable inductance inductor module using the load current supplied by the at least one power delivery circuit; determine an inductor element configuration in the variable inductance inductor module to provide the determined inductance value; and cause the third plurality of switch elements to transition to a state to provide the inductor element configuration in the variable inductance inductor module.

Example 10 may include elements of any of examples 1 through 9 and the semiconductor package may additionally include: one or more capacitive elements conductively coupled to the at least one power delivery circuit.

According to example 11, there is provided a power delivery method. The method may include: receiving, by control circuitry, at least one signal containing information indicative of a load current supplied to a load by at least one power delivery circuit, the power delivery circuit including a conductively coupled inductor module; receiving, by control circuitry, at least one signal containing information indicative of an allowable current threshold of the inductor module conductively coupled to the power delivery circuit; and determining, by the control circuitry, whether the load current supplied by the at least one power delivery circuit exceeds the allowable current threshold for the inductor module.

Example 12 may include elements of example 11 where receiving at least one signal containing information indicative of a load current supplied to a load by at least one power delivery circuit may further include: receiving, by control circuitry, the at least one signal containing information indicative of the load current supplied to the load disposed on a semiconductor die by at least one power delivery circuit, the power delivery circuit including an inductor module that includes one or more inductive elements disposed in a semiconductor package substrate, the semiconductor die conductively coupled to the semiconductor package substrate by an interposer layer die that includes a plurality of switches.

Example 13 may include elements of any of examples 11 or 12 where receiving at least one signal containing information indicative of a load current supplied to a load by at least one power delivery circuit may further include receiving, by control circuitry disposed at least partially in the interposer layer, at least one signal containing information indicative of the load current supplied to a load by the at least one power delivery circuit.

Example 14 may include elements of any of examples 11 through 13, and the method may further include: conductively coupling, by the control circuitry, a floating inductor module to the at least one power delivery circuit, responsive to determining the load current supplied by the at least one power delivery circuit exceeds the allowable current threshold of the inductor module.

Example 15 may include elements of any of examples 11 through 14 where conductively coupling a floating inductor module to the at least one power delivery circuit, responsive to determining the load current supplied by the at least one power delivery circuit exceeds the allowable current threshold of the inductor module may further include selectively positioning each of the plurality of switch elements disposed in the interposer layer to conductively couple the floating inductor module to the at least one power delivery circuit, responsive to determining the load current supplied by the at least one power delivery circuit exceeds the allowable current threshold of the inductor module, the floating inductor module including one or more inductive elements disposed in the semiconductor package substrate.

Example 16 may include elements of any of examples 11 through 15 where conductively coupling a floating inductor module to the at least one power delivery circuit, responsive to determining the load current supplied by the at least one power delivery circuit exceeds the allowable current threshold of the inductor module may include conductively coupling, by the control circuitry, a variable inductance floating inductor module to the at least one power delivery circuit responsive to determining the load current supplied by the at least one power delivery circuit exceeds the allowable current threshold of the inductor module, the variable inductance floating inductor module including a second plurality of switch elements disposed in the interposer layer and a plurality of inductive elements disposed in the semiconductor package substrate.

Example 17 may include elements of any of examples 11 through 16, and the method may further include: determining, by the control circuitry, an inductance value for the variable inductance floating inductor module using the load current supplied to the load by the at least one power delivery circuit and the allowable current threshold for the inductor module conductively coupled to the power delivery circuit; determining, by the control circuitry, an inductor element configuration in the variable inductance floating inductor module to provide the determined inductance value; and causing, by the control circuitry, the second plurality of switch elements to transition to a state that provides the determined inductor element configuration in the variable inductance floating inductor module.

Example 18 may include elements of any of examples 11 through 17, and the method may further include: responsive to determining the load current supplied by the at least one power delivery circuit is less than the allowable current threshold, determining, by the control circuitry, an inductance value for a variable inductance inductor module conductively coupled to the at least one power delivery circuit, the inductance value determined using the load current supplied by the at least one power delivery circuit, the variable inductance inductor module including a plurality of inductive elements disposed in the semiconductor package substrate; determining an inductor element configuration in the variable inductance inductor module to provide the determined inductance value; and causing each of a third plurality of switch elements disposed in the interposer layer to transition to a state to provide the inductor element configuration in the variable inductance inductor module.

Example 19 may include element of any of examples 11 through 18 where receiving at least one signal containing information indicative of a load current supplied to a load by at least one power delivery circuit may further include: receiving, by the control circuitry at least one signal containing information indicative of the load current supplied to a communicably coupled central processing unit (CPU) core by the at least one power delivery circuit.

According to example 20, there is provided a semiconductor package. The package may include: a semiconductor die that includes a one or more loads, each of the one or more load conductively coupled to a respective power delivery circuit; a semiconductor package substrate that includes: a plurality of inductor modules, each of the plurality of inductor modules conductively coupled to a respective one of the power delivery circuits, each of the plurality of inductor modules having a respective allowable current threshold; and at least one floating inductor module conductively coupleable to any of the processor cores; an interposer layer conductively coupling the semiconductor die with the semiconductor package substrate, the interposer layer including a plurality of switch elements to selectively conductively couple the at least one floating inductor module to each of the power delivery circuits; and control circuitry to: receive information indicative of the load current supplied to at least one power delivery circuit; receive information indicative of the allowable current threshold of the at least one power delivery circuit; and determine whether the load current supplied by the at least one power delivery circuit exceeds the allowable current threshold for the inductor module conductively coupled to the at least one power delivery circuit.

Example 21 may include elements of example 20 where the control circuitry, responsive to determining the load current supplied by the at least one power delivery circuit exceeds the allowable current threshold of the inductor module, to further: conductively couple the at least one floating inductor module to the at least one power delivery circuit.

Example 22 may include elements of any of examples 20 or 21 where the at least one floating inductor module comprises a floating inductor module having at least one of: a floating inductor module having a fixed inductance value; or a variable inductance floating inductor module having a selectively variable inductance value provided by a plurality of inductive elements conductively coupled to a second plurality of switch elements disposed in the interposer layer, each of the second plurality of switch elements conductively coupled to the control circuitry; and wherein each of the plurality of inductor modules comprises an inductor module having at least one of: an inductor module having a fixed inductance value; or a variable inductance inductor module having a selectively variable inductance value provided by a plurality of inductive elements conductively coupled to a third plurality of switches disposed in the interposer layer, each of the third plurality of switches conductively coupled to the control circuitry.

Example 23 may include elements of any of examples 20 through 22 where the interposer layer includes at least a portion of the control circuitry.

Example 24 may include elements of any of examples 20 through 23 where the floating inductor module includes a variable inductance floating inductor module; and where the control circuitry, responsive to determining the load current supplied by the at least one power delivery circuit exceeds the allowable current threshold of the conductively coupled inductor module, to further: determine an inductance value for the variable inductance floating inductor module using the load current supplied by the at least one power delivery circuit and the allowable current threshold for the inductor module conductively coupled to the at least one power delivery circuit; determine an inductor element configuration in the variable inductance floating inductor module to provide the determined inductance value; and cause the second plurality of switch elements to transition to a state to provide the inductor element configuration in the variable inductance floating inductor module.

Example 25 may include elements of any of examples 20 through 24 where the inductor module includes a variable inductance inductor module; and where the control circuitry, responsive to determining the load current supplied by the at least one power delivery circuit is less than the allowable current threshold of the conductively coupled variable inductance inductor module, to further: determine an inductance value for the variable inductance inductor module using the load current supplied by the at least one power delivery circuit; determine an inductor element configuration in the variable inductance inductor module to provide the determined inductance value; and cause the third plurality of switch elements to transition to a state to provide the inductor element configuration in the variable inductance inductor module.

Example 26 may include elements of any of examples 20 through 25, and the semiconductor package may further include one or more capacitive elements conductively coupled to the at least one power delivery circuit.

According to example 27, there is provided a non-transitory storage medium that includes machine-readable instructions, that when executed by control circuitry, cause the control circuitry to: receive, from at least one power delivery circuit, at least one signal containing information indicative of a load current supplied to a load by at least one power delivery circuit, the at least one power delivery circuit including a conductively coupled inductor module; receive at least one signal containing information indicative of an allowable current threshold of the inductor module conductively coupled to the at least one power delivery circuit; and determine whether the load current supplied by the at least one power delivery circuit exceeds the allowable current threshold for the inductor module.

Example 28 may include elements of example 27 where the machine-readable instructions that cause the control circuitry to receive at least one signal containing information indicative of a load current supplied to a load by at least one power delivery circuit further causes the control circuitry to: receive the at least one signal containing information indicative of the load current supplied to a load disposed in a semiconductor die by at least one power delivery circuit that includes an inductor module, the inductor module including at least one inductive element disposed in a semiconductor package substrate.

Example 29 may include elements of any of examples 27 or 28 where the machine-readable instructions further cause the control circuitry to: conductively couple a floating inductor module to the at least one power delivery circuit, responsive to determining the load current supplied by the at least one power delivery circuit exceeds the allowable current threshold of the inductor module.

Example 30 may include elements of any of examples 27 through 29 where the machine-readable instructions that cause the control circuitry to conductively couple a floating inductor module to the at least one power delivery circuit further cause the control circuitry to: selectively position each of a plurality of switch elements disposed in the interposer layer to conductively couple a floating inductor module disposed in a semiconductor package substrate to the at least one power delivery circuit.

Example 31 may include elements of any of examples 27 through 30 where the machine-readable instructions that cause the control circuitry to selectively position each of a plurality of switch elements disposed in the interposer layer to conductively couple a floating inductor module disposed in a semiconductor package substrate to the at least one power delivery circuit further cause the control circuitry to: determine an inductance value for a variable inductance floating inductor module using the load current supplied by the at least one power delivery circuit and the allowable current threshold for the inductor module conductively coupled to the at least one power delivery circuit; determine an inductor element configuration in the variable inductance floating inductor module to provide the determined inductance value; and cause a second plurality of switch elements to transition to a state that provides the determined inductor element configuration in the variable inductance floating inductor module, the second plurality of switch elements disposed in the interposer layer.

Example 32 may include elements of any of examples 27 through 31 where the machine-readable instructions further cause the control circuitry to: responsive to determining the load current supplied by the at least one power delivery circuit is less than the allowable current threshold, determine an inductance value for a variable inductance inductor module conductively coupled to the at least one power delivery circuit, the inductance value determined using the load current supplied by the at least one power delivery circuit, the variable inductance inductor module including a plurality of elements disposed in the semiconductor package substrate; determine an inductor element configuration in the variable inductance inductor module to provide the determined inductance value; and cause a third plurality of switch elements disposed in the interposer layer to transition to a state that provides the inductor element configuration in the inductor module.

According to example 33, there is provided a power distribution system. The system may include: means for receiving at least one signal containing information indicative of a load current supplied to a load by at least one power delivery circuit, the power delivery circuit including a conductively coupled inductor module; means for receiving at least one signal containing information indicative of an allowable current threshold of the inductor module; and means for determining whether the load current supplied by the at least one power delivery circuit exceeds the allowable current threshold for the inductor module.

Example 34 may include elements of example 33, and the system may further include: means for conductively coupling a floating inductor module to the at least one power delivery circuit responsive to a determination that the load current supplied by the at least one power delivery circuit exceeds the allowable current threshold of the inductor module.

Example 35 may include elements of any of examples 33 or 34, where the means for conductively coupling a floating inductor module to the at least one power delivery circuit, responsive to a determination that the load current supplied by the at least one power delivery circuit exceeds the allowable current threshold of the inductor module further comprises: means for selectively positioning each of a plurality of switch elements to conductively couple a floating inductor module to the at least one power delivery circuit, each of the plurality of switch elements disposed in an interposer layer, the floating inductor module including one or more inductive elements disposed in a semiconductor package substrate.

Example 36 may include elements of any of examples 33 through 35, and the system may further include: means for determining an inductance value for a variable inductance floating inductor module using the load current supplied to the load by the at least one power delivery circuit and the allowable current threshold for the inductor module conductively coupled to the at least one power delivery circuit; means for determining an inductor element configuration in the variable inductance floating inductor module to provide the determined inductance value; and means for causing the second plurality of switch elements to transition to a state that provides the determined inductor element configuration in the variable inductance floating inductor module.

Example 37 may include elements of any of examples 33 through 36, and the system may further include: means for determining an inductance value for a variable inductance inductor module using the load current supplied by the at least one power delivery circuit, responsive to determining the load current supplied by the at least one power delivery circuit is less than the allowable current threshold of the inductor module conductively coupled to the at least one power delivery circuit; means for determining an inductor element configuration in the variable inductance inductor module to provide the determined inductance value; and means for causing the third plurality of switch elements to transition to a state that provides the inductor element configuration in the variable inductance inductor module.

According to example 38, there is provided a system for autonomously adjusting inductance in a power delivery circuit, the system being arranged to perform the method of any of examples 11 through 19.

According to example 39, there is provided a chipset arranged to perform the method of any of examples 11 through 19.

According to example 40, there is provided a machine-readable medium that includes a plurality of instructions that, in response to be being executed on a computing device, cause the computing device to carry out the method according to any of examples 11 through 19.

According to example 41, there is provided a device configured for autonomously adjusting inductance in a power delivery circuit, the device being arranged to perform the method of any of the examples 11 through 19.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents.

What is claimed is:

1. A power delivery system, comprising:
    a plurality of power delivery circuits, each of the power delivery circuits to supply a load current to a respective one of a plurality of loads, the plurality of loads conductively coupled to the plurality of power delivery circuits;
    a plurality of inductor modules, each of the plurality of inductor modules having an allowable current threshold, each of the plurality of inductor modules conductively coupled to a respective one of the power delivery circuits;
    at least one floating inductor module, the at least one floating inductor module conductively couplable to any of the plurality of power delivery circuits; and
    control circuitry to:
        receive information indicative of the load current supplied to at least one of the plurality of power delivery circuits;
        receive information indicative of the allowable current threshold of the at least one power delivery circuit; and
        determine whether the load current supplied by the at least one power delivery circuit exceeds the allowable current threshold for the inductor module conductively coupled to the at least one power delivery circuit.

2. The power delivery system of claim 1:
    wherein each of the plurality of inductor modules comprises an inductor module formed in a semiconductor package substrate;
    wherein the at least one floating inductor module comprises at least one floating inductor module disposed in the semiconductor package substrate;
    wherein each of a plurality of switch elements selectively conductively couples the at least one floating inductor module to a respective one of the plurality of power delivery circuits.

3. The power delivery system of claim 2 wherein the control circuitry, responsive to determining the load current supplied by the at least one power delivery circuit exceeds the allowable current threshold, to further:
    conductively couple the floating inductor module to the at least one power delivery circuit.

4. The power delivery system of claim 3:
    wherein the plurality of conductively coupled loads comprise loads disposed in one or more semiconductor dies included in the semiconductor package; and
    wherein the plurality of switch elements include a plurality of semiconductor devices disposed in an interposer layer conductively coupled between the one or more semiconductor dies and the semiconductor package substrate.

5. The power delivery system of any of claim 4:
    wherein the at least one floating inductor module comprises a floating inductor module having at least one of:
        a floating inductor module having a fixed inductance value; or
        a variable inductance floating inductor module having a selectively variable inductance value provided by a plurality of inductive elements conductively coupled to a second plurality of switch elements, each of the second plurality of switch elements conductively coupled to the control circuitry; and
    wherein each of the plurality of inductor modules comprises an inductor module having at least one of:
        an inductor module having a fixed inductance value; or
        a variable inductance inductor module having a selectively variable inductance value provided by a plurality of inductive elements conductively coupled to a third plurality of switches, each of the third plurality of switches conductively coupled to the control circuitry.

6. The power delivery system of claim 4 wherein the interposer layer includes at least a portion of the control circuitry.

7. The power delivery system of claim 5:
    wherein the second plurality of switch elements is disposed in the interposer layer; and
    wherein the third plurality of switch elements is disposed in the interposer layer.

8. The power delivery system of claim 5:
    wherein the floating inductor module comprises a variable inductance floating inductor module; and
    wherein the control circuitry, responsive to determining the load current supplied by the at least one power delivery circuit exceeds the allowable current threshold, to further:
        determine an inductance value for the variable inductance floating inductor module using the load current supplied by the at least one power delivery circuit and the allowable current threshold for the inductor module conductively coupled to the at least one power delivery circuit;
        determine an inductor element configuration in the variable inductance floating inductor module to provide the determined inductance value; and
        cause the second plurality of switch elements to transition to a state to provide the inductor element configuration in the variable inductance floating inductor module.

9. The power delivery system of claim 5:
    wherein the inductor module comprises a variable inductance inductor module; and
    wherein the control circuitry, responsive to determining the load current supplied by the at least one power delivery circuit is less than the allowable current threshold, to further:
        determine an inductance value for the variable inductance inductor module using the load current supplied by the at least one power delivery circuit;
        determine an inductor element configuration in the variable inductance inductor module to provide the determined inductance value; and cause the third plurality of switch elements to transition to a state to provide the inductor element configuration in the variable inductance inductor module.

10. The power delivery system of claim 1, further comprising one or more capacitive elements conductively coupled to the at least one power delivery circuit.

11. A voltage regulation method, comprising:
receiving, by control circuitry, at least one signal containing information indicative of a load current supplied to a load by at least one power delivery circuit, the power delivery circuit including an inductor module;
receiving, by control circuitry, at least one signal containing information indicative of an allowable current threshold of the inductor module; and
determining, by the control circuitry, whether the load current supplied by the at least one power delivery circuit exceeds the allowable current threshold for the inductor module, wherein receiving at least one signal containing information indicative of a load current supplied to a load by at least one power delivery circuit further comprises:
receiving, by control circuitry, the at least one signal containing information indicative of the load current supplied to the load disposed on a semiconductor die by at least one power delivery circuit, the power delivery circuit including an inductor module that includes one or more inductive elements disposed in a semiconductor package substrate, the semiconductor die conductively coupled to the semiconductor package substrate by an interposer layer die that includes a plurality of switches.

12. The power delivery method of claim 11 wherein receiving at least one signal containing information indicative of a load current supplied to a load by at least one power delivery circuit further comprises:
receiving, by control circuitry disposed at least partially in the interposer layer, at least one signal containing information indicative of the load current supplied to a load by the at least one power delivery circuit.

13. The power delivery method of claim 11, further comprising:
conductively coupling, by the control circuitry, a floating inductor module to the at least one power delivery circuit, responsive to determining the load current supplied by the at least one power delivery circuit exceeds the allowable current threshold of the inductor module.

14. The method of claim 11, wherein conductively coupling a floating inductor module to the at least one power delivery circuit, responsive to determining the load current supplied by the at least one power delivery circuit exceeds the allowable current threshold of the inductor module further comprises:
selectively positioning each of the plurality of switch elements disposed in the interposer layer to conductively couple the floating inductor module to the at least one power delivery circuit, responsive to determining the load current supplied by the at least one power delivery circuit exceeds the allowable current threshold of the inductor module, the floating inductor module including one or more inductive elements disposed in the semiconductor package substrate.

15. The power delivery method of claim 11 wherein conductively coupling a floating inductor module to the at least one power delivery circuit, responsive to determining the load current supplied by the at least one power delivery circuit exceeds the allowable current threshold of the inductor module comprises: conductively coupling, by the control circuitry, a variable inductance floating inductor module to the at least one power delivery circuit responsive to determining the load current supplied by the at least one power delivery circuit exceeds the allowable current threshold of the inductor module, the variable inductance floating inductor module including a second plurality of switch elements disposed in the interposer layer and a plurality of inductive elements disposed in the semiconductor package substrate.

16. The power delivery method of claim 15, further comprising:
determining, by the control circuitry, an inductance value for the variable inductance floating inductor module using the load current supplied to the load by the at least one power delivery circuit and the allowable current threshold for the inductor module conductively coupled to the power delivery circuit; determining, by the control circuitry, an inductor element configuration in the variable inductance floating inductor module to provide the determined inductance value; and causing, by the control circuitry, the second plurality of switch elements to transition to a state that provides the determined inductor element configuration in the variable inductance floating inductor module.

17. The power delivery method of claim 12, further comprising: responsive to determining the load current supplied by the at least one power delivery circuit is less than the allowable current threshold, determining, by the control circuitry, an inductance value for a variable inductance inductor module conductively coupled to the at least one power delivery circuit, the inductance value determined using the load current supplied by the at least one power delivery circuit, the variable inductance inductor module including a plurality of inductive elements disposed in the semiconductor package substrate; determining an inductor element configuration in the variable inductance inductor module to provide the determined inductance value; and
causing each of a third plurality of switch elements disposed in the interposer layer to transition to a state to provide the inductor element configuration in the variable inductance inductor module.

18. The power delivery method of claim 11 wherein receiving at least one signal containing information indicative of a load current supplied to a load by at least one power delivery circuit further comprises: receiving, by the control circuitry at least one signal containing information indicative of the load current supplied to a central processing unit (CPU) core by the at least one power delivery circuit.

19. A non-transitory storage medium that includes machine-readable instructions, that when executed by control circuitry, cause the control circuitry to: receive, from at least one power delivery circuit, at least one signal containing information indicative of a load current supplied to a load by at least one power delivery circuit, the at least one power delivery circuit including an inductor module; receive at least one signal containing information indicative of an allowable current threshold of the inductor module; and determine whether the load current supplied by the at least one power delivery circuit exceeds the allowable current threshold for the inductor module, wherein receiving at least one signal containing information indicative of a load current supplied to a load by at least one power delivery circuit further comprises:
receiving, by control circuitry, the at least one signal containing information indicative of the load current supplied to the load disposed on a semiconductor die by at least one power delivery circuit, the power delivery circuit including an inductor module that includes one or more inductive elements disposed in a semiconductor package substrate, the semiconductor die conductively coupled to the semiconductor package substrate by an interposer layer die that includes a plurality of switches.

20. The non-transitory storage medium of claim 19 wherein the machine-readable instructions further cause the control circuitry to:
   conductively couple a floating inductor module to the at least one power delivery circuit, responsive to determining the load current supplied by the at least one power delivery circuit exceeds the allowable current threshold of the inductor module.

21. The non-transitory storage medium of claim 20 wherein the machine-readable instructions that cause the control circuitry to conductively couple a floating inductor module to the at least one power delivery circuit further cause the control circuitry to:
   selectively position each of a plurality of switch elements disposed in the interposer layer to conductively couple a floating inductor module disposed in a semiconductor package substrate to the at least one power delivery circuit.

22. The non-transitory storage medium of claim 21 wherein the machine-readable instructions that cause the control circuitry to selectively position each of a plurality of switch elements disposed in the interposer layer to conductively couple a floating inductor module disposed in a semiconductor package substrate to the at least one power delivery circuit further cause the control circuitry to:
   determine an inductance value for a variable inductance floating inductor module using the load current supplied by the at least one power delivery circuit and the allowable current threshold for the inductor module conductively coupled to the at least one power delivery circuit;
   determine an inductor element configuration in the variable inductance floating inductor module to provide the determined inductance value; and
   cause a second plurality of switch elements to transition to a state that provides the determined inductor element configuration in the variable inductance floating inductor module, the second plurality of switch elements disposed in the interposer layer.

23. The non-transitory machine-readable storage medium of claim 22 wherein the machine-readable instructions further cause the control circuitry to:
   responsive to determining the load current supplied by the at least one power delivery circuit is less than the allowable current threshold, determine an inductance value for a variable inductance inductor module conductively coupled to the at least one power delivery circuit, the inductance value determined using the load current supplied by the at least one power delivery circuit, the variable inductance inductor module including a plurality of elements disposed in the semiconductor package substrate;
   determine an inductor element configuration in the variable inductance inductor module to provide the determined inductance value; and
   cause a third plurality of switch elements disposed in the interposer layer to transition to a state that provides the inductor element configuration in the inductor module.

* * * * *